United States Patent
Maruyama et al.

(10) Patent No.: US 7,932,126 B2
(45) Date of Patent: Apr. 26, 2011

(54) SEMICONDUCTOR DEVICE AND MANUFACTURING METHOD THEREOF

(75) Inventors: Junya Maruyama, Kanagawa (JP); Toru Takayama, Kanagawa (JP); Masafumi Morisue, Kanagawa (JP); Ryosuke Watanabe, Kanagawa (JP); Eiji Sugiyama, Kanagawa (JP); Susumu Okazaki, Kanagawa (JP); Kazuo Nishi, Yamanashi (JP); Jun Koyama, Kanagawa (JP); Takeshi Osada, Kanagawa (JP); Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 153 days.

(21) Appl. No.: 12/349,026

(22) Filed: Jan. 6, 2009

(65) Prior Publication Data

US 2009/0117681 A1   May 7, 2009

Related U.S. Application Data

(62) Division of application No. 10/952,914, filed on Sep. 30, 2004, now Pat. No. 7,495,272.

(30) Foreign Application Priority Data

Oct. 6, 2003   (JP) ................................ 2003-347646

(51) Int. Cl.
   *H01L 21/00*   (2006.01)
(52) U.S. Cl. ..... 438/96; 438/98; 438/151; 257/E27.132; 257/E27.133
(58) Field of Classification Search ............ 438/96, 438/98, 151; 257/E27.132, E27.133
See application file for complete search history.

(56) References Cited

U.S. PATENT DOCUMENTS

| | | | |
|---|---|---|---|
| 4,085,411 | A | 4/1978 | Genesi |
| 4,454,416 | A | 6/1984 | Gontowski, Jr. |
| 4,485,301 | A | 11/1984 | Gontowski, Jr. |
| 4,979,007 | A | 12/1990 | Ogawa et al. |
| 4,988,631 | A | 1/1991 | Ogawa et al. |
| 5,352,921 | A | 10/1994 | Codama et al. |
| 5,420,452 | A | 5/1995 | Tran |
| 5,481,118 | A | 1/1996 | Tew |

(Continued)

FOREIGN PATENT DOCUMENTS

EP   251 563   1/1988

(Continued)

OTHER PUBLICATIONS

"A visible light sensor and an amplifier circuit Succeeded in forming them within the size of 2 X 1.5mm on a plastic chip"; *Denpa Shinbun* with full translation; Oct. 2, 2003.

(Continued)

*Primary Examiner* — Minh-Loan T Tran
(74) *Attorney, Agent, or Firm* — Fish & Richardson P.C.

(57) ABSTRACT

The area occupied by a photo-sensor element may be reduced and multiple elements may be integrated in a limited area so that the sensor element can have higher output and smaller size. Higher output and miniaturization are achieved by uniting a sensor element using an amorphous semiconductor film (typically an amorphous silicon film) and an output amplifier circuit including a TFT with a semiconductor film having a crystal structure (typically a poly-crystalline silicon film) used as an active layer over a plastic film substrate that can resist the temperature in the process for mounting such as a solder reflow process. A sensor element that can resist bending stress can be obtained.

19 Claims, 12 Drawing Sheets
(1 of 12 Drawing Sheet(s) Filed in Color)

U.S. PATENT DOCUMENTS

| | | | |
|---|---|---|---|
| 5,501,989 | A | 3/1996 | Takayama |
| 5,589,694 | A | 12/1996 | Takayama |
| 5,648,662 | A | 7/1997 | Zhang |
| 5,744,822 | A | 4/1998 | Takayama |
| 5,757,456 | A | 5/1998 | Yamazaki |
| 5,811,328 | A | 9/1998 | Zhang |
| 5,821,138 | A | 10/1998 | Yamazaki |
| 5,834,327 | A | 11/1998 | Yamazaki |
| 5,841,180 | A | 11/1998 | Kobayashi |
| 5,936,231 | A | 8/1999 | Michiyama |
| 5,955,726 | A | 9/1999 | Takashima |
| 6,002,157 | A | 12/1999 | Kozuka |
| 6,087,648 | A | 7/2000 | Zhang |
| 6,118,502 | A | 9/2000 | Yamazaki |
| 6,124,155 | A | 9/2000 | Zhang |
| 6,166,399 | A | 12/2000 | Zhang |
| 6,194,740 | B1 | 2/2001 | Zhang |
| 6,198,133 | B1 | 3/2001 | Yamazaki |
| 6,204,519 | B1 | 3/2001 | Yamazaki |
| 6,236,063 | B1 | 5/2001 | Yamazaki |
| 6,243,155 | B1 | 6/2001 | Zhang |
| 6,274,861 | B1 | 8/2001 | Zhang |
| 6,287,888 | B1 | 9/2001 | Sakakura |
| 6,335,213 | B1 | 1/2002 | Zhang |
| 6,350,981 | B1 | 2/2002 | Uno |
| 6,376,333 | B1 | 4/2002 | Yamazaki |
| 6,399,933 | B2 | 6/2002 | Zhang |
| 6,424,326 | B2 | 7/2002 | Yamazaki |
| 6,462,806 | B2 | 10/2002 | Zhang |
| 6,496,240 | B1 | 12/2002 | Zhang |
| 6,531,711 | B2 | 3/2003 | Sakakura |
| 6,583,439 | B2 | 6/2003 | Yamazaki |
| 6,680,764 | B2 | 1/2004 | Zhang |
| 6,734,907 | B1 | 5/2004 | Hagihara |
| 6,747,638 | B2 | 6/2004 | Yamazaki |
| 6,784,411 | B2 | 8/2004 | Zhang |
| 6,809,718 | B2 | 10/2004 | Wei |
| 6,814,832 | B2 | 11/2004 | Utsunomiya |
| 6,822,211 | B2 | 11/2004 | Hagihara |
| 6,828,951 | B2 | 12/2004 | Yamazaki |
| 6,858,898 | B1 | 2/2005 | Hayakawa |
| 6,864,950 | B2 | 3/2005 | Zhang |
| 6,867,752 | B1 | 3/2005 | Yamazaki |
| 6,891,391 | B2 | 5/2005 | Hiroki |
| 6,930,326 | B2 | 8/2005 | Kato |
| 6,937,306 | B2 | 8/2005 | Zhang |
| 6,982,406 | B2 | 1/2006 | Chen |
| 6,995,753 | B2 | 2/2006 | Yamazaki |
| 6,998,282 | B1 | 2/2006 | Yamazaki |
| 7,030,551 | B2 | 4/2006 | Yamazaki |
| 7,046,282 | B1 | 5/2006 | Zhang |
| 7,050,138 | B1 | 5/2006 | Yamazaki |
| 7,173,279 | B2 | 2/2007 | Yamazaki |
| 7,286,173 | B2 | 10/2007 | Zhang et al. |
| 2001/0030704 | A1 | 10/2001 | Kimura |
| 2001/0038065 | A1 | 11/2001 | Kimura |
| 2002/0011978 | A1 | 1/2002 | Yamazaki |
| 2002/0012057 | A1 | 1/2002 | Kimura |
| 2002/0042171 | A1 | 4/2002 | Zhang |
| 2002/0044208 | A1 | 4/2002 | Yamazaki |
| 2002/0074551 | A1 | 6/2002 | Kimura |
| 2002/0127785 | A1 | 9/2002 | Zhang |
| 2002/0130322 | A1 | 9/2002 | Zhang |
| 2003/0032210 | A1 | 2/2003 | Takayama |
| 2003/0032213 | A1 | 2/2003 | Yonezawa |
| 2003/0071953 | A1 | 4/2003 | Yamazaki |
| 2003/0134048 | A1 | 7/2003 | Shiotsuka |
| 2003/0166336 | A1 | 9/2003 | Kato |
| 2003/0201450 | A1 | 10/2003 | Yamazaki |
| 2003/0217805 | A1 | 11/2003 | Takayama |
| 2004/0079941 | A1 | 4/2004 | Yamazaki |
| 2004/0121602 | A1 | 6/2004 | Maruyama |
| 2004/0217357 | A1 | 11/2004 | Zhang |
| 2004/0263712 | A1 | 12/2004 | Yamazaki |
| 2005/0029518 | A1 | 2/2005 | Kato |
| 2005/0052584 | A1 | 3/2005 | Yamazaki |
| 2005/0056842 | A1 | 3/2005 | Nishi |
| 2005/0070038 | A1 | 3/2005 | Yamazaki |
| 2005/0082463 | A1 | 4/2005 | Koyama |
| 2005/0161675 | A1 | 7/2005 | Kimura |
| 2005/0162421 | A1 | 7/2005 | Yamazaki |
| 2005/0162578 | A1 | 7/2005 | Yamazaki |
| 2005/0195129 | A1 | 9/2005 | Yamazaki |
| 2005/0202609 | A1 | 9/2005 | Zhang |
| 2005/0206830 | A1 | 9/2005 | Zhang |
| 2006/0082568 | A1 | 4/2006 | Yamazaki |
| 2007/0114532 | A1 | 5/2007 | Yamazaki |
| 2007/0126904 | A1 | 6/2007 | Kimura |
| 2007/0267665 | A1 | 11/2007 | Koyama |
| 2007/0290246 | A1 | 12/2007 | Zhang et al. |

FOREIGN PATENT DOCUMENTS

| | | |
|---|---|---|
| JP | 56-048184 | 5/1981 |
| JP | 61-105980 | 5/1986 |
| JP | 62-142351 | 6/1987 |
| JP | 62-144354 | 6/1987 |
| JP | 62-219963 | 9/1987 |
| JP | 62-293763 | 12/1987 |
| JP | 63-114164 | 5/1988 |
| JP | 63-122166 | 5/1988 |
| JP | 63-190379 | 8/1988 |
| JP | 63-269569 | 11/1988 |
| JP | 01-289381 | 11/1989 |
| JP | 02-280373 | 11/1990 |
| JP | 06-029567 | 2/1994 |
| JP | 06-45354 | 2/1994 |
| JP | 06-275808 | 9/1994 |
| JP | 06-334206 | 12/1994 |
| JP | 07-086607 | 3/1995 |
| JP | 08-064795 | 3/1996 |
| JP | 08-250745 | 9/1996 |
| JP | 08-264796 | 10/1996 |
| JP | 08-288522 | 11/1996 |
| JP | 09-036340 | 2/1997 |
| JP | 11-097690 | 4/1999 |
| JP | 11-243209 | 9/1999 |
| JP | 2000-200898 | 7/2000 |
| JP | 2001-320547 | 11/2001 |
| JP | 2002-062856 | 2/2002 |
| JP | 2002-176162 | 6/2002 |
| JP | 3329512 | 9/2002 |
| JP | 2002-303676 | 10/2002 |
| JP | 2002-305297 | 10/2002 |
| JP | 2002-359364 | 12/2002 |
| JP | 2003-047017 | 2/2003 |
| JP | 2003-060744 | 2/2003 |
| JP | 2003-174153 | 6/2003 |

OTHER PUBLICATIONS

"Developing a thin and high output visible light sensor using a plastic substrate"; *TDK homepage*; with full translation; Oct. 1, 2003.
"Amorphous Silicon Semiconductor Optical Sensors for Brightness Adjustment Control of the Lighting Systems, etc., BCS series"; *TDK homepage* with full translation; Jun. 2002.
"Thin and high output visible light sensor"; *Kagaku Kougyou Shinbun* with full translation; Oct. 2, 2003.
"Bring about high output and downsizing"; *The Nikkan Kogyo Shinbun, Ltd.* with full translation; Oct. 2, 2003.
Office Action (Chinese Patent Application No. 200410083451.2) mailed May 9, 2008 (with English translation).

SEMICONDUCTOR DEVICE AND MANUFACTURING METHOD THEREOF

CROSS-REFERENCE TO RELATED APPLICATIONS

This application is a divisional of U.S. application Ser. No. 10/952,914, filed Sep. 30, 2004, now allowed, which claims the benefit of a foreign priority application filed in Japan as Serial No. 2003-347646 on Oct. 6, 2003, both of which are incorporated by reference.

BACKGROUND OF THE INVENTION

1. Field of the Invention

The present invention relates to a semiconductor device having a sensor element and a circuit including a thin film transistor (hereinafter referred to as a TFT) and to its manufacturing method.

It is noted that the semiconductor device herein indicates a general device that can function by utilizing semiconductor characteristic. An electro-optical device, a semiconductor circuit, and an electronic apparatus are included in the semiconductor device.

2. Related Art

Conventionally, there are a sensor element using a single-crystal silicon substrate and a sensor element using an amorphous silicon film as a solid imaging element.

The characteristic of the sensor element using the single-crystal silicon substrate is that high output can be obtained by manufacturing an output amplifier circuit on the single-crystal silicon substrate and by integrating this output amplifier circuit with the sensor element. However, there are problems that the completed parts to be packaged don't have a compact shape because a wavelength sensitivity correcting filter is necessary and that the characteristic of the sensor element using the single-crystal silicon substrate varies widely.

On the other hand, the characteristic of the sensor element using the amorphous silicon film is that a correction filter such as an infrared light cut filter is not necessary because the wavelength sensitivity of this sensor element is close to that of the human eye. However, the output value of the sensor element is limited because it is not amplified. Therefore, since the output value of the sensor element is small, it is easily affected by the noise of another signal or the like. The output value of the sensor element depends on the absolute amount of the sensor element such as the area or the thickness of the sensor element. Therefore, it is necessary to enlarge the area of the sensor element using the amorphous silicon film in order to increase the output value of the sensor element using the amorphous silicon film.

It is possible to amplify the output of the sensor element using the amorphous silicon film by providing an operational amplifier externally to the sensor element using the amorphous silicon film. In this case, however, there is another problem that the number of external parts increases so that the sensor circuit becomes large.

The photosensitivity of the sensor element using the amorphous silicon film is not more than $1/10$ of the sensor element using the single-crystal silicon substrate. Therefore, when the sensor element using the amorphous silicon film is employed in the display device requiring a large area such as a liquid crystal projector, the display device is easily affected by the noise because a lead wiring is long in the large display device. Therefore, since a shield covering a wiring is necessary in order to use the sensor element using the amorphous silicon film in the large display device, the cost for manufacturing the display device increases.

The present inventors have submitted patent documents 1 to 4 concerning the semiconductor device having a sensor element and a circuit including a TFT over a glass substrate.

[patent document 1] Japanese Patent Laid-Open No. H6-275808

[patent document 2] Japanese Patent Laid-Open No. 2001-320547

[patent document 3] Japanese Patent Laid-Open No. 2002-62856

[patent document 4] Japanese Patent Laid-Open No. 2002-176162

SUMMARY OF THE INVENTION

It is an object of the present invention to miniaturize the area occupied by the element and to integrate a plenty of elements in a limited area so that the sensor element can have higher output and smaller size.

When the sensor element using the single-crystal silicon substrate and the sensor element using the amorphous silicon film have the smaller size, the region where the parts are mounted also becomes smaller accordingly. Therefore, when the parts are mounted by soldering for example, it is difficult to keep the parts fixed firmly. In the case where the region in which the parts are fixed is small and where the degree of hardness of the sensor element (which means the mechanical strength of the single-crystal silicon substrate or the glass substrate) is high, when the bending stress is applied to the parts, the stress is not relaxed sufficiently and therefore the parts may not be fixed firmly any more because the firmness and the mechanical stress are off balance.

Consequently, it is also an object of the present invention to provide a sensor element having high resistance against the bending stress.

In the present invention, higher output and miniaturization are achieved by uniting a sensor element using an amorphous semiconductor film (typically an amorphous silicon film) and an output amplifier circuit including a TFT with a semiconductor film having a crystal structure (typically a poly-crystalline silicon film) used as an active layer over a plastic film substrate that can resist the temperature in the process for mounting such as a solder reflow process. In addition, since a photo sensor element is directly connected to an amplifier circuit on a sensor substrate, the noise is unlikely to be superposed. Moreover, the present invention can provide a sensor element having high resistance against the bending stress.

According to the present invention, in a light-receiving region of a sensor element having a pair of electrodes, a first electrode is not provided to overlap the whole area of the light-receiving region but provided to overlap only a part of the light-receiving region. As a result, more amount of light is absorbed in the photoelectric conversion layer. Therefore, almost all the light incident into the photoelectric conversion layer does not transmit through the first electrode (a transparent electrode) but transmits through only an interlayer insulating film, a base insulating film, and a film substrate to reach the photoelectric conversion layer. It is noted that a second electrode is provided all over the light-receiving region of the sensor element. When the photoelectric conversion layer has a multilayer structure including a p-type semiconductor layer or an n-type semiconductor layer, the photoelectric conversion layer functions as a p-type semiconductor layer or an n-type semiconductor layer. However, the p-type semiconductor layer and the n-type semiconductor layer are referred to neither as the first electrode nor as the second electrode.

The present invention discloses a semiconductor device where a chip having a photo sensor element and an amplifier circuit is mounted. The photo sensor element includes a first electrode, a photoelectric conversion layer including a semiconductor film having an amorphous structure over the first electrode, and a second electrode over the photoelectric conversion layer. The amplifier circuit includes a TFT with a semiconductor film having a crystal structure used as an active layer.

The semiconductor device of the present invention can function as a photo sensor. The light incident into a diode (photodiode) is absorbed in the photoelectric conversion layer and forms a photoelectric charge. The amount of the photoelectric charge formed by this light depends on the amount of light absorbed in the photoelectric conversion layer. The photoelectric charge formed by the light is amplified by the circuit including the TFT and is detected.

The diode of the present invention is a Schottky diode with the photoelectric conversion layer sandwiched between the first electrode and the second electrode. It is noted that not only the above diode but also a PIN-type diode, a PN-type diode, an avalanche diode, or the like can be used as the photoelectric conversion element for converting the light into the electrical signal.

It is noted that the photoelectric conversion layer sandwiched between the first electrode and the second electrode may be a single layer of an i-type (intrinsic) semiconductor layer, a p-type semiconductor layer, or an n-type semiconductor layer. Alternatively, the photoelectric conversion layer sandwiched between the first electrode and the second electrode may be two layers such as the i-type (intrinsic) semiconductor layer and the n-type semiconductor layer; the i-type (intrinsic) semiconductor layer and the p-type semiconductor layer; or the p-type semiconductor layer and the n-type semiconductor layer.

The PIN-type photodiode includes a pair of electrodes, the p-type semiconductor layer, the n-type semiconductor layer, and the i-type (intrinsic) semiconductor layer sandwiched between the p-type semiconductor layer and the n-type semiconductor layer.

The present invention discloses a semiconductor device where a chip having a photo sensor element and an amplifier circuit is mounted. The photo sensor element includes a first electrode, a p-type amorphous semiconductor layer partially contacting on the first electrode, a photoelectric conversion layer including a semiconductor film having an amorphous structure contacting on the p-type amorphous semiconductor layer, an n-type amorphous semiconductor layer contacting on the photoelectric conversion layer including the semiconductor film having the amorphous structure, and a second electrode contacting on the n-type amorphous semiconductor layer. The amplifier circuit includes an n-channel TFT with a semiconductor film having a crystal structure used as an active layer.

In addition, not only the amorphous semiconductor film but also a crystalline semiconductor film such as a microcrystal semiconductor film can be used as the p-type semiconductor layer, the n-type semiconductor layer, and the i-type (intrinsic) semiconductor layer.

The present invention discloses a semiconductor device where a chip having a photo sensor element and an amplifier circuit is mounted. The photo sensor element includes a first electrode, a photoelectric conversion layer including a crystalline semiconductor film over the first electrode, and a second electrode over the photoelectric conversion layer. The amplifier circuit includes a TFT with a semiconductor film having a crystal structure used as an active layer.

The density of an impurity imparting n-type or p-type can be increased by using the micro-crystal semiconductor film and therefore the electric resistance of the film can be lowered.

As the p-type semiconductor layer, the n-type semiconductor layer, and the i-type (intrinsic) semiconductor layer, it is possible to use a semiconductor material obtained by a reduced-pressure thermal CVD method, a plasma CVD method, a sputtering method, or the like. For example, silicon or silicon germanium alloy ($Si_{1-x}Ge_x$ (X=0.0001 to 0.02)) can be used.

In this specification, a film including a crystal grain having a grain size more than 50 nm is referred to as a semiconductor film having a crystal structure. More specifically, a film including a crystal grain having a grain size ranging from approximately several nm to 50 nm is referred to as a crystalline semiconductor film. It is noted that the amorphous semiconductor film including a crystal grain having a size ranging from approximately several nm to 50 nm is also referred to as the crystalline semiconductor film.

The present invention discloses a semiconductor device in which a chip having a photo sensor element and an amplifier circuit is mounted. The photo sensor element includes an electrode on a cathode side (a first electrode), a photoelectric conversion layer including a semiconductor film having an amorphous structure partially contacting on the electrode on the cathode side, and an electrode on an anode side (a second electrode) contacting on the photoelectric conversion layer. The amplifier circuit includes an n-channel TFT with a semiconductor film having a crystal structure used as an active layer. The photo sensor element and the amplifier circuit are provided over a plastic substrate through an adhesion layer In the present invention, the first electrode is formed of the same material as that of a source electrode or a drain electrode of the n-channel TFT. In addition, the photoelectric conversion layer is provided to contact on an interlayer insulating film of the n-channel TFT.

Not only the n-channel TFT but also a p-channel TFT can be used. The present invention discloses a semiconductor device where a chip having a photo sensor element and an amplifier circuit is mounted. The photo sensor element includes a first electrode, a p-type amorphous semiconductor layer partially contacting on the first electrode, a photoelectric conversion layer including a semiconductor film having an amorphous structure contacting on the p-type amorphous semiconductor layer, an n-type amorphous semiconductor layer contacting on the photoelectric conversion layer including the semiconductor film having the amorphous structure, and a second electrode contacting on the n-type amorphous semiconductor layer. The amplifier circuit includes a p-channel TFT with a semiconductor film having a crystal structure used as an active layer.

In the case of the PIN-type photodiode, a p-type semiconductor layer and an n-type semiconductor layer among the p-type semiconductor layer, the n-type semiconductor layer, and an i-type (intrinsic) semiconductor layer may be formed of a crystalline semiconductor film. The present invention discloses a semiconductor device where a chip having a photo sensor element and an amplifier circuit is mounted. The photo sensor element includes a first electrode, a p-type crystalline semiconductor layer partially contacting on the first electrode, a photoelectric conversion layer including a semiconductor layer having an amorphous structure contacting on the p-type crystalline semiconductor layer, an n-type crystalline semiconductor layer contacting on the photoelectric conversion layer including the semiconductor layer having the amorphous structure, and a second electrode contacting on the n-type crystalline semiconductor layer. The amplifier circuit includes an n-channel TFT with a semiconductor film having a crystal structure used as an active layer.

In the above structure, not only the n-channel TFT but also a p-channel TFT can be used. The present invention discloses a semiconductor device where a chip having a photo sensor element and an amplifier circuit is mounted. The photo sensor element includes a first electrode, a p-type crystalline semiconductor layer partially contacting on the first electrode, a photoelectric conversion layer including a semiconductor film having an amorphous structure contacting on the p-type crystalline semiconductor layer, an n-type crystalline semiconductor layer contacting on the photoelectric conversion layer including the semiconductor film having the amorphous structure, and a second electrode contacting on the n-type crystalline semiconductor layer. The amplifier circuit includes a p-channel TFT with a semiconductor film having a crystal structure used as an active layer.

In the case of the PIN-type photodiode, only an n-type semiconductor layer among a p-type semiconductor layer, the n-type semiconductor layer, and an i-type (intrinsic) semiconductor layer may be formed of a crystalline semiconductor film. The present invention discloses a semiconductor device where a chip having a photo sensor element and an amplifier circuit is mounted. The photo sensor element includes a first electrode, a p-type amorphous semiconductor layer partially contacting on the first electrode, a photoelectric conversion layer including a semiconductor film having an amorphous structure contacting on the p-type amorphous semiconductor layer, an n-type crystalline semiconductor layer contacting on the photoelectric conversion layer including the semiconductor film having the amorphous structure, and a second electrode contacting on the n-type crystalline semiconductor layer. The amplifier circuit includes an n-channel TFT with a semiconductor film having a crystal structure used as an active layer.

In the above structure, not only the n-channel TFT but also a p-channel TFT can be used. The present invention discloses a semiconductor device where a chip having a photo sensor element and an amplifier circuit is mounted. The photo sensor element includes a first electrode, a p-type amorphous semiconductor layer partially contacting on the first electrode, a photoelectric conversion layer including a semiconductor film having an amorphous structure contacting on the p-type amorphous semiconductor layer, an n-type crystalline semiconductor layer contacting on the photoelectric conversion layer including the semiconductor film having the amorphous structure, and a second electrode contacting on the n-type crystalline semiconductor layer. The amplifier circuit includes a p-channel TFT with a semiconductor film having a crystal structure used as an active layer.

In the case of a PIN-type photodiode, only a p-type semiconductor layer among the p-type semiconductor layer, an n-type semiconductor layer, and an i-type (intrinsic) semiconductor layer may be formed of a crystalline semiconductor film. The present invention discloses a semiconductor device where a chip having a photo sensor element and an amplifier circuit is mounted. The photo sensor element includes a first electrode, a p-type crystalline semiconductor layer partially contacting on the first electrode, a photoelectric conversion layer including a semiconductor film having an amorphous structure contacting on the p-type crystalline semiconductor layer, an n-type amorphous semiconductor layer contacting on the photoelectric conversion layer including the semiconductor film having the amorphous structure, and a second electrode contacting on the n-type amorphous semiconductor layer. The amplifier circuit includes an n-channel TFT with a semiconductor film having a crystal structure used as an active layer.

In the above structure, not only the n-channel TFT but also a p-channel TFT may be used. The present invention discloses a semiconductor device where a chip having a photo sensor element and an amplifier circuit is mounted. The photo sensor element includes a first electrode, a p-type crystalline semiconductor layer partially contacting on the first electrode, a photoelectric conversion layer including a semiconductor film having an amorphous structure contacting on the p-type crystalline semiconductor layer, an n-type amorphous semiconductor layer contacting on the photoelectric conversion layer including the semiconductor film having the amorphous structure, and a second electrode contacting on the n-type amorphous semiconductor layer. The amplifier circuit includes a p-channel TFT with a semiconductor film having a crystal structure used as an active layer.

In each of the above structures, the photo sensor element and the amplifier circuit are provided over a plastic substrate through an adhesion layer.

In each of the above structure, an external terminal of the chip having the plastic substrate has a two-terminal structure, which is a structure having as few pins as the conventional single amorphous visible light sensor, and it is possible to detect the visible light in the mounted position.

The present invention discloses a method for manufacturing a semiconductor device where a chip having a photo sensor element and an amplifier circuit is mounted. The method comprises the steps of; forming a first electrode contacting on an interlayer insulating film of a thin film transistor at the same time as forming a source electrode or a drain electrode connecting to a source region or a drain region of the thin film transistor of the amplifier circuit; laminating a first conductive crystalline semiconductor film, an amorphous semiconductor film, and a second conductive crystalline semiconductor film sequentially to cover the first electrode and the interlayer insulating film; forming a second electrode on the second conductive crystalline semiconductor film; and etching the first conductive crystalline semiconductor film, the amorphous semiconductor film, and the second conductive crystalline semiconductor film in a self-aligning manner using the second electrode as a mask.

In the above manufacturing method, the multilayer formed by the first conductive crystalline semiconductor film, the amorphous semiconductor film, and the second conductive crystalline semiconductor film is a photoelectric conversion layer. The first electrode is an electrode on a cathode side and the second electrode is an electrode on an anode side.

In the semiconductor device obtained by the above manufacturing method, an edge surface of the second electrode and an edge surface of the photoelectric conversion layer are made to match by etching using the second electrode as a mask.

In the present invention, the sensor element and the amplifier circuit are transferred to a plastic film substrate by using a peeling and transferring technique disclosed in Japanese patent Laid-Open No. 2003-174153. Not only the technique disclosed in the above patent Laid-Open but also another technique (such as a technique disclosed in Japanese patent Laid-Open No. H08-288522, H08-250745, or H08-264796, which is the peeling technique for removing the film to be peeled by dry etching or wet etching) may be used.

The present invention discloses a method for manufacturing a semiconductor device where a chip having a photo sensor element and an amplifier circuit is mounted comprising the steps of; forming a layer to be peeled including an amplifier circuit and a photo sensor element over a first substrate; peeling the layer to be peeled including the amplifier circuit and the photo sensor element from the first substrate; transferring the layer to be peeled including the amplifier circuit and the photo sensor element to a second substrate; manufacturing a chip including the amplifier circuit and the photo sensor element by separating the second substrate; and mounting the chip including the amplifier circuit and the photo sensor element in a print wiring substrate by a solder reflow process.

In the above structure, the step of peeling the film to be peeled including the amplifier circuit and the photo sensor element from the first substrate and transferring it to the second substrate further includes; a first step of applying an organic resin film that is soluble in an solution on the layer to be peeled; a second step of adhering a third substrate to the organic resin film by a first two-sided tape so that the layer to be peeled and the organic resin film are sandwiched between the first substrate and the third substrate; a third step of adhering a forth substrate to the first substrate by a second two-sided tape; a fourth step for separating the first substrate with the forth substrate adhered and the layer to be peeled by physical means or by etching; a fifth step of adhering the second substrate to the layer to be peeled by a first adhesion material so that the layer to be peeled is sandwiched between the third substrate and the second substrate; a sixth step of separating the layer to be peeled with the first two-sided tape adhered and the third substrate; a seventh step of separating the film to be peeled and the first two-sided tape; and an eighth step of removing the organic resin film In the above manufacturing method, the solution is water or alcohols. The first substrate is a glass substrate and the third and the forth substrates are a quartz substrate or a metal substrate in the above manufacturing method. Moreover, the second substrate is a plastic film substrate in the above manufacturing method.

The present invention can be applied to a TFT having any structure. For example, the present invention can be applied to a top-gate TFT, a bottom-gate (inversely staggered) TFT, or a staggered TFT. In addition, the TFT may have not only a single-gate structure but also a multi-gate structure having a plurality of channel-forming regions, for example a double-gate structure.

By integrally forming a visible light sensor and an amplifier circuit including a TFT over a same substrate, it is possible to reduce the cost, to decrease the volume of the parts because it can be made thinner, to miniaturize the area where the parts are mounted, and to reduce the superposition of the noise.

When the visible light sensor is formed using the amorphous silicon film, the infrared light cut filter is no longer necessary, and the visible light sensor with the variation in the output value reduced between the visible light sensors can be obtained. In addition, the amplifier circuit including the TFT formed over the same substrate makes it possible to increase the output current and to suppress the variation. Moreover, since the amplifier circuit can amplify the output, the light-receiving region can be made small. Therefore, the apparatus can be miniaturized and can be made lightweight, and the number of parts can be reduced.

The impact resistance can be increased by using the plastic film substrate, and the visible light sensor that can be bent and twisted can be obtained. Moreover, the visible light sensor can be mounted on a curved surface because of its thinness. With the plastic film substrate having high resistance against the heat, the visible light sensor can be mounted by a solder reflow process as well as conventional SMD parts.

BRIEF DESCRIPTION OF THE DRAWINGS

The file of this patent contains at least one drawing executed in color. Copies of this patent with color drawings will be provided by the Patent and Trademark Office upon request and payment of the necessary fee.

DETAILED DESCRIPTION OF THE INVENTION

An embodiment mode of the present invention is hereinafter explained.

Figure 1A:
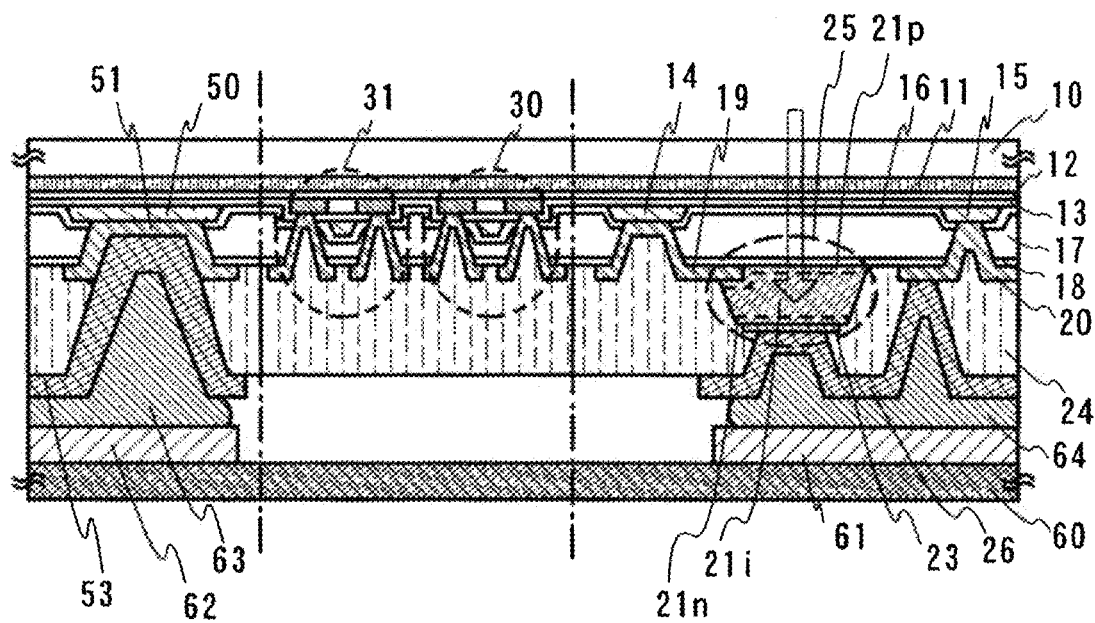
FIG. 1A is a cross-sectional view of the photo sensor of the present invention and FIG. 1B is a circuit diagram.

FIG. 1A is a cross-sectional view of a mounted photo sensor chip of the present invention. FIG. 1A shows a visible light sensor chip (2.0 mm×1.5 mm) having two terminals. In FIG. 1A, a reference numeral 10 denotes a film substrate, a reference numeral 11 is an adhesion layer, a reference numeral 12 denotes a base insulating film, and a reference numeral 13 denotes a gate insulating film. Since the light to be received passes through the film substrate 10, the adhesion layer 11, the base insulating film 12, and the gate insulating film 13, these are preferably made of the material having high transmittance. Moreover, a plastic substrate that can resist the heat up to the temperature (approximately 250° C.) in the mounting process such as the solder reflow process is used as the film substrate 10. For example, an HT substrate (manufactured by Nippon Steel Chemical Co., Ltd) having a glass transition temperature Tg of 400° C. or more is used as the film substrate 10. Moreover, the HT substrate has high transmittance (90% or more to the wavelength of 400 nm) and low-thermal expansion characteristic (CTE<48 ppm).

A PIN-type photodiode 25 has a first electrode 19, a second electrode 23, a p-type semiconductor layer 21p, an n-type semiconductor layer 21n, and an i-type (intrinsic) semiconductor layer 21i sandwiched between the p-type semiconductor layer and the n-type semiconductor layer.

The amplifier circuit provided over the same substrate in order to amplify the output value of the PIN-type photodiode 25 has a current mirror circuit formed by n-channel TFTs 30 and 31. Although FIG. 1A illustrates only two TFTs, actually two n-channel TFTs 30 (channel size L/W=8 μm/50 μm) and ten n-channel TFTs 31 (channel size L/W=8 μm/50 μm) are provided in order to multiply the output value by five times. In this embodiment, one n-channel TFT 30 and a hundred n-channel TFTs 31 (channel size L/W=8 μm/50 μm) are provided in order to multiply the output value by 100 times.

Figure 1B:
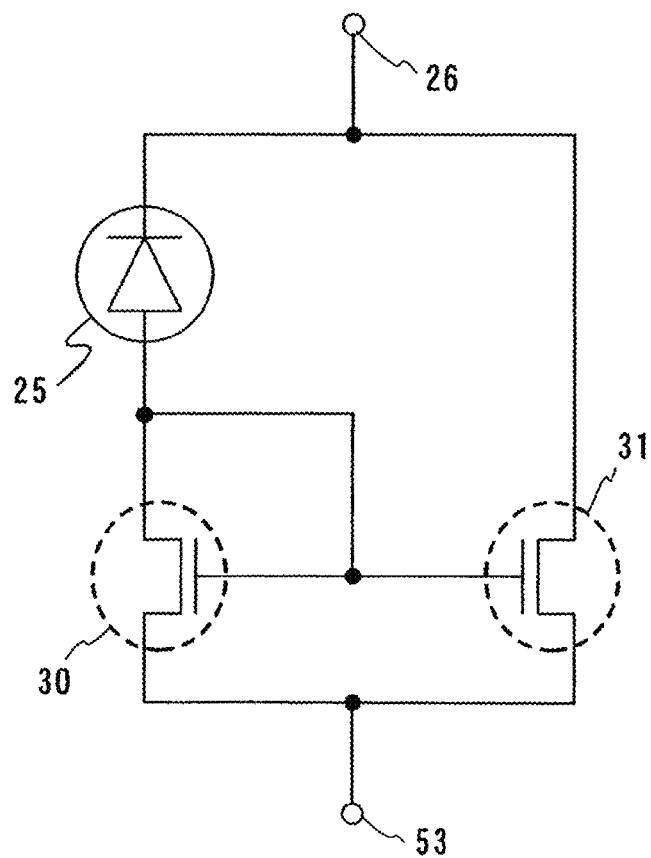

FIG. 1B is an equivalent circuit diagram of the visible light sensor chip having two terminals. Although FIG. 1B is an equivalent circuit diagram using the n-channel TFT, only the p-channel TFT may be also used.

Figure 12:
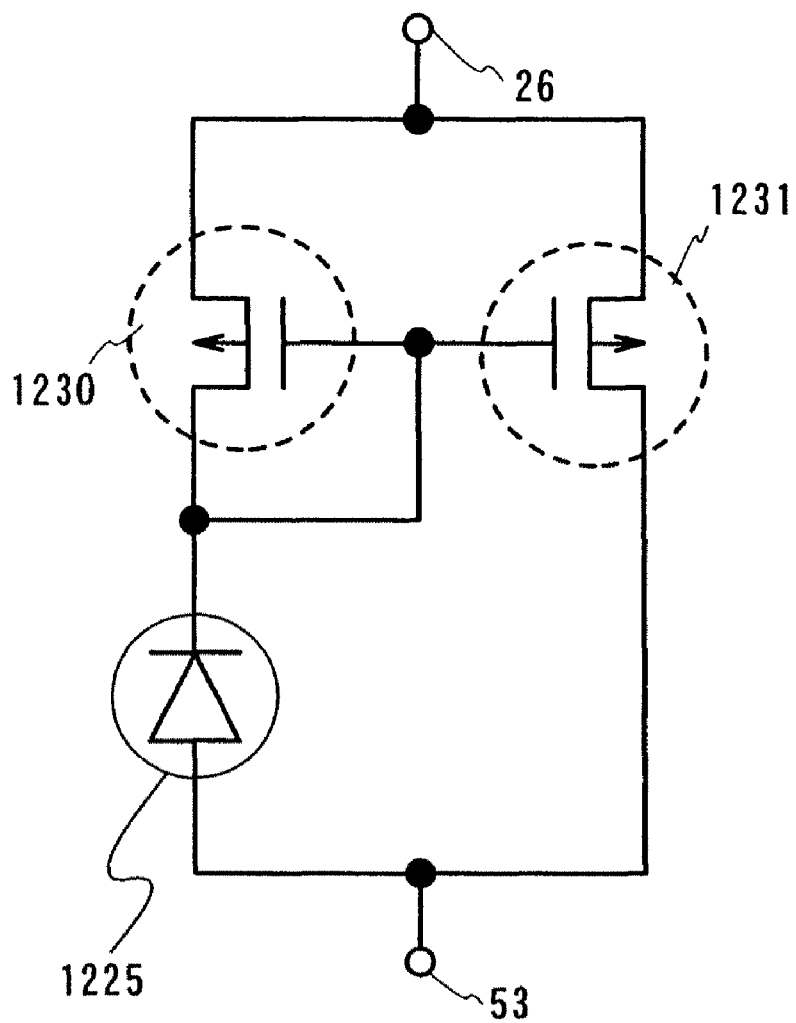
FIG. 12 is a circuit diagram for showing another example of the photo sensor of the present invention.

In the case of using the p-channel TFT, the equivalent circuit diagram is as shown in FIG. 12. Terminal electrodes 26 and 53 in FIG. 12 are the same as those in FIG. 1B, and they may be connected to a photodiode 1225 and p-channel TFTs 1230 and 1231 respectively as shown in FIG. 12. In the case of using the p-channel TFT, the p-channel TFT 1230 is connected electrically to an electrode on an anode side of the photodiode 1225. The photodiode 1225 may be formed by forming a first electrode (an electrode on a cathode side) after laminating an n-type semiconductor layer, an i-type semiconductor layer, and a p-type semiconductor layer sequentially on a second electrode (an electrode on an anode side) connecting with the p-channel TFT 1230. The order of the lamination of the films may be inverted. In this case, the photodiode is formed by forming a second electrode (an electrode on an anode side) connecting with the p-channel TFT 1230 after laminating the p-type semiconductor layer, the i-type semiconductor layer, and the n-type semiconductor layer sequentially on the first electrode (an electrode on a cathode side) and then by forming a terminal electrode on a cathode side connecting with the first electrode.

In order to amplify the output value further, the amplifier circuit may have an operational amplifier in which the n-channel TFT or the p-channel TFT is combined appropriately. In this case, however, the number of terminals is five. It is possible to decrease the number of terminals to four by decreasing the number of power supplies when the amplifier circuit has the operational amplifier and when a level shifter is used.

Although this embodiment shows an example in which the n-channel TFTs 30 and 31 are top-gate TFTs having a single gate structure, they may have a double gate structure to reduce the variation in the on-current between the TFTs. Furthermore, in order to decrease the off current value, the n-channel TFTs 30 and 31 may have a LDD (Lightly Doped Drain) structure. The LDD structure is a structure in which a region with an impurity element added at low concentration, which is referred to as an LDD region, is provided between the channel-forming region and a source region or a drain region formed by adding the impurity element at high concentration. The LDD structure has an advantageous effect of relaxing the electric field near the drain and preventing the deterioration due to the hot-carrier injection. Moreover, in order to prevent the lowering of the on-current value due to the hot carrier, the n-channel TFTs 30 and 31 may have a GOLD (Gate-drain Overlapped LDD) structure. The GOLD structure, which is a structure where the LDD region is disposed through the gate insulating film so as to overlap the gate electrode, has a higher advantageous effect of relaxing the electric field near the drain and preventing the deterioration due to the hot-carrier injection than the LDD structure. Thus, the GOLD structure is efficient in preventing the deterioration by relaxing the electric field intensity near the drain and by the hot-carrier injection.

The wiring 14 is connected to a first electrode 19 and extends to the channel-forming region of the TFT 30 of the amplifier circuit and therefore the wiring also works as a gate electrode.

The wiring 15 is connected to a second electrode 23 and to a drain electrode or a source electrode of the TFT 31. Moreover, reference numerals 16 and 18 denote inorganic insulating films, a reference numeral 17 denotes an insulating film formed by a coating method, and a reference numeral 20 denotes a connection electrode. Since the light to be received passes through the inorganic insulating films 16, 18, and the insulating film 17 formed by the coating method, it is desirable that these films is formed of the material having high transmittance. It is noted that not only the insulating film formed by the coating method but also an inorganic insulating film formed by the CVD method may be used as the insulating film 17. When the inorganic insulating film formed by the CVD method is used as the insulating film 17, the fixing strength can be improved.

A terminal electrode 50 is formed in the same process for forming the wirings 14 and 15. A terminal electrode 51 is formed in the same process for forming the wirings 19 and 20.

A terminal electrode 26 on an anode side is connected to a second electrode 23 and is mounted on an electrode 61 on a print wiring substrate 60 by solder 64. On the other hand, a terminal electrode 53 on a cathode side is formed in the same process for forming the terminal electrode 26 and is mounted on an electrode 62 on a print wiring substrate 60 by solder 63

The manufacturing step for obtaining the above structure is hereinafter explained with reference to FIGS. 2A to 3C. The semiconductor element formed over the glass substrate is peeled and transferred so that it is pasted to the film substrate 10 using the adhesion layer 11.

This embodiment mode explains an example where the semiconductor element is peeled and transferred by a peeling method using a metal film (such as W, WN, or Mo) and a silicon oxide film formed by a sputtering method.

Initially, a semiconductor element is formed over a glass substrate (a first substrate 70). An AN 100 is herein used as the glass substrate. Then, a metal film 71, herein a tungsten film (a film-forming condition for lowering the film stress: Ar flow rate is 100 sccm, a film-forming pressure is 2 Pa, a film-forming power is 4 kW, a substrate temperature is 200° C., a film thickness is from 10 to 200 nm, preferably from 50 to 75 nm), is formed over the glass substrate by the sputtering method. After that, without releasing it into the air, an oxide film to become a first layer of the base insulating film 12, which is herein a silicon oxide film, is laminated in thickness from 150 to 200 nm by the sputtering method. It is desirable that the oxide film is the twice or more as thick as the metal film. It is noted that when these films are laminated, an amorphous metal oxide film (a tungsten oxide film) is formed in thickness from approximately 2 to 5 nm between the metal film 71 and the silicon oxide film. In the following step of peeling, separation occurs in the inside of the tungsten film; at the interface between the tungsten oxide film and the silicon oxide film; or at the interface between the tungsten oxide film and the tungsten film. Not only the tungsten film but also a single layer or laminated layers formed of an element selected from the group consisting of Ti, Ta, Mo, Nd, Ni, Co, Zr, Zn, Ru, Rh, Pd, Os, and Ir or formed of an alloy material or a compound material mainly including the above element can be used. Moreover, the above single layer or laminated layers including nitrogen such as titan nitride, tungsten nitride, tantalum nitride, or molybdenum nitride can be also used.

It is noted that since the film is formed even on the edge surface of the substrate by the sputtering method, the tungsten film, the tungsten oxide film, and the silicon oxide film formed on the edge surface of the substrate are preferably etched away selectively by dry etching using $SF_6$ gas and He gas and by $O_2$ ashing.

Subsequently, a silicon oxynitride film to become a second layer of the base insulating film 12 is formed 100 m in thickness by a PCVD method. Then an amorphous silicon film including hydrogen is laminated thereon 54 nm in thickness without releasing it into the air. It is noted that the silicon oxynitride film is a blocking layer for preventing the diffusion of the impurity such as alkali metal from the glass substrate.

Next, the above amorphous silicon film is crystallized by the known method (such as a solid phase crystallization method, a laser crystallizing method, a crystallization method using a catalyst metal, or the like) and thus a poly-crystalline silicon film used as an active layer is formed. In this embodiment, the poly-crystalline silicon film is obtained by the crystallizing method using the catalyst metal. A nickel acetate solution including nickel by 10 ppm in weight is applied to the above amorphous silicon film by a spinner. Alternatively, the nickel element may be sprayed to the whole surface of the above amorphous silicon film by the sputtering method. After that, the amorphous silicon film is crystallized by performing the heating process and a semiconductor film having a crystal structure (herein a poly-crystalline silicon layer) is formed. After a heat treatment (for an hour at a temperature of 500° C.), a silicon film having the crystal structure is obtained by performing the heat treatment (for four hours at a temperature of 550° C.) for the crystallization.

When the poly-crystalline silicon film is formed by heating the amorphous silicon film at a temperature of 410° C. or more, since the amorphous silicon film includes hydrogen, the hydrogen can be separated from the silicon film at the same time as forming the poly-crystalline silicon film. The heat treatment at a temperature of 400° C. or more crystallizes the amorphous metal oxide film, and a metal oxide film having the crystal structure can be obtained. Therefore, when the heat treatment is performed at a temperature of 410° C. or more, the metal oxide film having the crystal structure is formed and the hydrogen is separated. After the heat treatment at a temperature of 410° C. or more, separation occurs in the inside of the tungsten oxide film; at the interface between the tungsten oxide film and the silicon oxide film; or at the interface between the tungsten oxide film and the tungsten film by adding a comparatively small force (for example, hand power, air pressure of gas blown from a nozzle and ultrasonic wave). It is noted that when the heat treatment is performed at the temperature that is high enough to obtain the metal oxide film having the crystal structure, the composition of the metal oxide film changes and the metal oxide film becomes somewhat thin. Moreover, the tungsten oxide film has plural kinds of crystal structures ($WO_2$, $WO_3$, $WO_x$ ($2<x<3$)) and $WO_3$ changes into $WO_2$ or $WO_x$ by the heat treatment.

Next, after removing the oxide film on the surface of the silicon film having the crystal structure by dilute hydrofluoric acid or the like, the laser light (XeCl: wavelength 308 nm) is irradiated under an air or oxygen atmosphere in order to increase the degree of crystallinity and to repair the defect left in the crystal grain. The excimer laser light having a wavelength of 400 nm or shorter or a second harmonic or a third harmonic of a YAG laser is used. The pulsed laser light having a pulse repetition rate ranging from approximately 10 to 1000 Hz is irradiated and scanned on the surface of the silicon film in such a way that the laser light is condensed by an optical system so as to have the energy density ranging from 100 to 500 $mJ/cm^2$ and that the overlap rate is set in the range of 90 to 95%. In this embodiment mode, the pulse repetition rate is 30 Hz and the energy density is 470 $mJ/cm^2$. It is noted that an oxide film is formed on the surface of the silicon film because the laser light is irradiated under the air or oxygen atmosphere. Although the present embodiment mode shows the example of using the pulsed laser, a continuous wave laser may be also used. When the continuous wave laser is used, an amorphous semiconductor film is preferably crystallized by using a continuous wave solid-state laser and by applying second to fourth harmonics with respect to the fundamental wave. Typically a second harmonic (532 nm) or a third harmonic (355 nm) of a Nd: $YVO_4$ laser (fundamental wavelength 1064 nm) may be used. In the case of using the continuous wave laser, the laser light emitted from the continuous wave $YVO_4$ laser is converted into the harmonic having an output power of 10 W by a non-linear optical element. The harmonic can be also obtained by putting a $YVO_4$ crystal and the non-linear optical element in the resonator. It is preferable to shape the laser light into rectangular or elliptical on the irradiated surface through an optical system and the laser light is irradiated to a processing object. On this occasion, the energy density ranging from approximately 0.01 to 100 $MW/cm^2$ (preferably from 0.1 to 10 $MW/cm^2$) is necessary. Then the laser light may be irradiated to the semiconductor film while moving the semiconductor film relative to the laser light at a speed ranging from approximately 10 to 2000 cm/s.

Then, in addition to the oxide film formed by the above laser irradiation, an oxide film is further formed by processing the surface using ozone water for 120 seconds. The oxide film formed thus having a thickness from 1 to 5 nm in total works as a barrier layer. The barrier layer is formed in order to remove the nickel added in the crystallization from the silicon film. Although the barrier layer is formed by using the ozone water in this embodiment, the present invention is not limited to this. The barrier layer may be formed by depositing an oxide film in thickness from approximately 1 to 10 nm according to a method in which the surface of the semiconductor film having the crystal structure is oxidized by the irradiation of the ultraviolet ray under the oxygen atmosphere; a method in which the surface of the semiconductor film having the crystal structure is oxidized by a oxygen plasma process; a plasma CVD method; a sputtering method; or a vapor deposition method. The oxide film formed by the laser irradiation may be removed before forming the barrier layer.

Subsequently, an amorphous silicon film including an argon element to become a gettering site is formed on the barrier layer in thickness from 10 to 400 nm by the sputtering method. In this embodiment mode, the amorphous silicon film including an argon element is formed in 100 nm thick under an atmosphere including argon using a silicon target. In the case of using a plasma CVD method, the amorphous silicon film including the argon element is formed under the condition where the flow ratio of monosilane and argon ($SiH_4$:Ar) is 1:99, the film-forming pressure is 6.665 Pa (0.05 Torr), RF power density is 0.087 $W/cm^2$, and the film-forming temperature is 350%.

After that, the gettering is performed by the heating treatment for three minutes in the furnace having a temperature of 650° C. Thus, the density of nickel in the semiconductor film having the crystal structure is decreased. Not only the furnace but also a lamp annealing apparatus may be used.

Next, after removing selectively the amorphous silicon film including the argon element, which is a gettering site, using the barrier layer as an etching stopper, the barrier layer is removed selectively by dilute hydrofluoric acid. It is noted that since the nickel is likely to move to the region where the concentration of oxygen is high in the gettering process, the barrier layer including the oxide film is preferably removed after the gettering.

When the semiconductor film is not crystallized using the catalyst element, the steps of forming the barrier layer, forming the gettering site, heating for the gettering, removing the gettering site, removing the barrier layer, and the like are not necessary.

Subsequently, after a thin oxide film is formed on the surface of the obtained silicon film having the crystal structure (also referred to as a poly-silicon film) using the ozone water, a first photo mask is used to form a resist mask, and an etching process is performed so that an island-shaped semiconductor layer is formed. After forming the island-shaped semiconductor layer, the resist mask is removed.

Next, a small amount of impurity element (boron or phosphorus) is added in order to control the threshold of the TFT if necessary. An ion doping method is herein performed in such a way that diborane ($B_2H_6$) is excited to be plasma and it is added to the island-shaped semiconductor layer without mass-separation.

Then, after removing the oxide film by etchant including hydrofluoric acid at the same time as washing the surface of the silicon film, an insulating film mainly including silicon to become a gate insulating film 13 is formed. A silicon oxynitride film (composition ratio Si=32%, O=59%, N=7%, H=2%) is formed in 115 nm thick by a plasma CVD method.

Next, after forming a metal film on the gate insulating film, a second photo mask is formed and the metal film is patterned so that a gate electrode, wirings 14 and 15, and a terminal electrode 50 are formed by using the second photo mask. Then, a source region or a drain region of a TFT is formed by doping the active layer.

After a first interlayer insulating film including a silicon oxide film (not shown diagrammatically) is formed in 50 nm thick by the CVD method, a process for activating the impurity element added in the respective semiconductor layers is performed. This activation process may be performed by a rapid thermal anneal (RTA) method using a lamp light source, a method in which a YAG laser or an excimer laser is irradiated from the rear surface, a thermal treatment using a furnace, or a method in which any one of these is combined with another.

Next, after a second interlayer insulating film 16 made of a silicon nitride oxide film including hydrogen is formed, a thermal treatment (for 1 to 12 hours at temperatures from 300 to 550° C.) is performed to hydrogenate the semiconductor layer. This process is to terminate a dangling bond in the semiconductor layer using the hydrogen included in the first interlayer insulating film 16. The semiconductor layer can be hydrogenated whether the insulating film 13 including the silicon oxide film exists or not.

Subsequently, a third interlayer insulating film 17 made of an insulating material is formed on the second interlayer insulating film 16. An organic insulating film formed by the coating method or the inorganic insulating film formed by the CVD method can be used as the third interlayer insulating film 17. An acrylic resin film having a thickness of 0.8 μm is formed in this embodiment.

Next, a fourth interlayer insulating film 18 is formed of an inorganic insulating material in thickness from 250 to 350 nm on the third interlayer insulating film 17 by the sputtering method. It is noted that the fourth interlayer insulating film 18 is not necessary when the inorganic insulating film is formed as the third interlayer insulating film.

Subsequently, a resist mask is formed using a third photo mask, and then a contact hole is formed by etching selectively the interlayer insulating films 16, 17, 18, and the gate insulating film 13. Then, the resist mask is removed.

Then, a resist mask is formed using a fourth photo mask after laminating the metal film. A first electrode 19, a connection electrode 20, a terminal electrode 51, and a source electrode or a drain electrode of the TFT are formed by etching the laminated metal film selectively. Then the resist mask is removed. It is noted that the laminated metal film is a three-layer structure including a Ti film having a thickness of 100 nm, an Al film including a small amount of Si having a thickness of 350 nm, and another Ti film having a thickness of 100 nm.

Figure 2A:
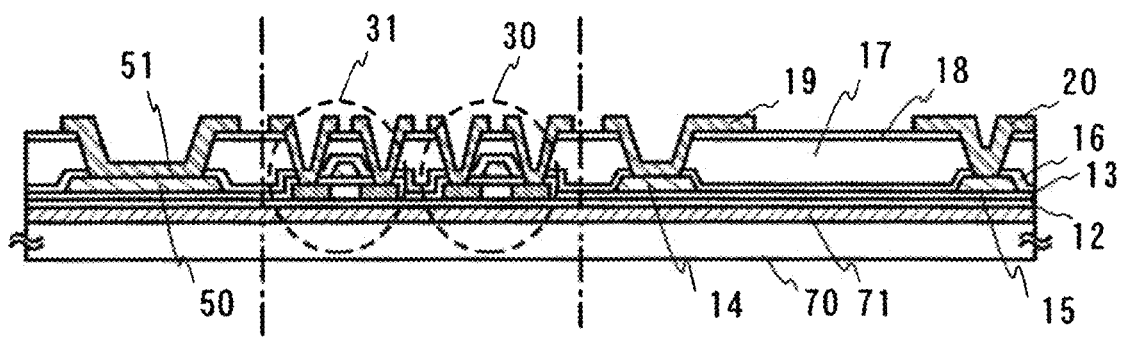
FIGS. 2A to 2C are cross-sectional views for showing the manufacturing process of the photo sensor device.

According to the above steps, top-gate TFTs 30 and 31 using the poly-silicon film as the active layer can be manufactured and a structure shown in FIG. 2A is obtained.

Next, a p-type semiconductor layer, an i-type (intrinsic) semiconductor layer, and an n-type semiconductor layer are laminated sequentially as a photoelectric conversion layer on the first electrode.

A p-type amorphous silicon film is formed in 50 nm thick as the p-type semiconductor layer by the PCVD method under the condition where the electrode interval is 32 mm, the film-forming pressure is 266 Pa, the RF power is 550 W, and $SiH_4$ (flow rate 4 sccm), $B_2H_6$ (flow rate 20 sccm), and $H_2$ (flow rate 773 sccm) are used as a material gas.

Moreover, an i-type amorphous silicon film is formed in 600 nm thick as the i-type (intrinsic) semiconductor layer by the PCVD method under the condition where the electrode interval is 36 mm, the film-forming pressure is 133 Pa, the RF power is in the range of 50 to 88 W, and $SiH_4$ (flow rate 100 sccm) and $H_2$ (flow rate 1000 sccm) are used as a material gas.

Moreover, an n-type amorphous silicon film is formed in 70 nm thick as the n-type semiconductor layer by the PCVD method under the condition where the electrode interval is 36 mm, the film-forming pressure is 133 Pa, the RF power is 300 W, and $SiH_4$ (flow rate 5 sccm), $PH_3$ (flow rate 30 sccm), and $H_2$ (flow rate 950 sccm) are used as a material gas.

Before forming the photoelectric conversion layer, a process for improving adhesiveness to the interlayer insulating film 18 such as an Ar plasma process or a $CF_4$ plasma process may be performed.

Subsequently, after forming a metal film, which is a Ti film having a thickness of 100 nm here, a fifth photo mask is used to form a resist mask. Then, the Ti film is etched to form a second electrode 23. Either dry etching or wet etching can be used, and etching is performed using etchant ($NH_4OH:H_2O_2:H_2O$=2:5:2). In the case of dry etching, $Cl_2$ gas may be used. Here, the area of the second electrode 23 of one photo sensor is 1.57 mm², which is almost equal to the light-receiving area. Then, the resist mask is removed.

Next, a sixth photo mask is used to form a resist mask, and photoelectric conversion layers 21*p*, 21*i*, and 21*n* are formed by etching the laminated layers of the amorphous silicon film selectively. Either the dry etching or the wet etching can be used and the dry etching is performed here using $SF_6$ (flow rate 20 sccm) and He (flow rate 20 sccm) as etching gas. Not only $SF_6$ but also $NF_3$ may be used in the dry etching. Then, the resist mask is removed.

Figure 2B:
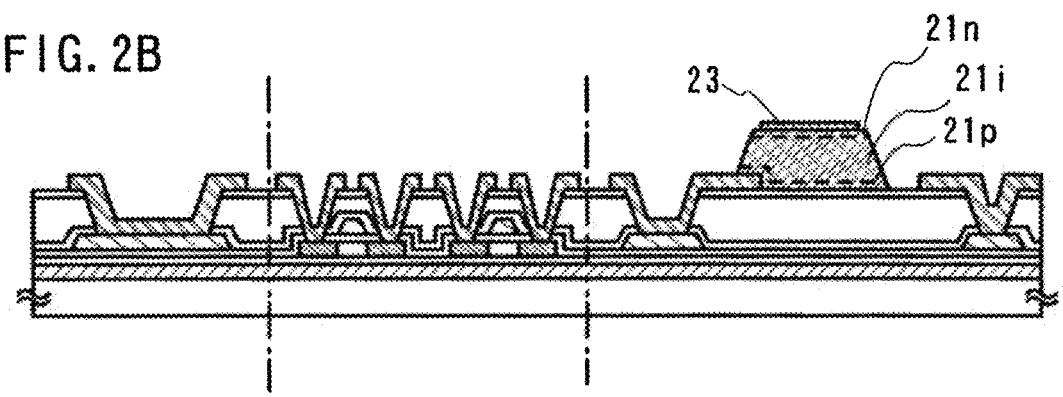

The above processes form a photodiode having the first electrode 19; the photoelectric conversion layers 21*p*, 21*i*, and 21*n* including the amorphous silicon film; and the second electrode 23 as shown in FIG. 2B.

Next, a sealing resin 24 is formed in a thickness ranging from 1 to 30 μm all over the surface of the photodiode as the insulating film. Here, an acrylic resin film having a thickness of 1.6 μm is formed as the insulating film. Alternatively, an insulating film formed of a $SiO_x$ film including alkyl group obtained by a coating method such as silica glass, alkyl siloxane polymer, alkyl silsesquioxane polymer, or silsesquioxane hydride polymer may be used. As an example of the siloxane polymer, PSB-K1 or PSB-K31, which is the insulating material for the coating manufactured by Toray, Inc, and ZRS-5PH, which is the insulating material for the coating manufactured by Catalysts & Chemicals Industries Co., Ltd, are given. With an insulating film formed of the $SiO_x$ film including alkyl group, mounting strength can be improved. Then, a seventh photo mask is used to form a resist mask, and a contact hole is formed by etching an organic insulating film selectively. Then the resist mask is removed.

Although the present embodiment shows the example of forming the sealing resin by patterning the resin film according to the photolithography technique, the present invention is not limited to this. For example, the sealing resin may be formed by a screen printing method. Alternatively, the inorganic insulating film formed by the CVD method may be used as the sealing layer.

Figure 5:
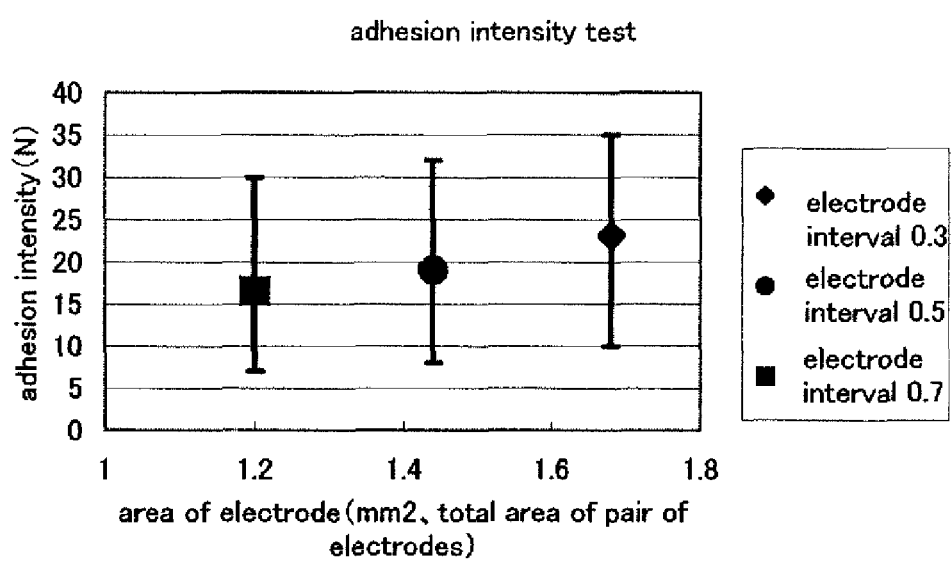
FIG. 5 is a graph for showing the adhesion intensity of the terminal electrode.

Subsequently, terminal electrodes 26 and 53 are formed by a sputtering method using a metal mask. The terminal electrodes 26 and 53 are formed by laminating a Ti film, a Ni film, and a Au film. FIG. 5 shows the result of evaluating the fixing strength of the laminated layers of the Ti film, the Ni film, and the Au film formed over the glass substrate by the sputtering method using the metal mask. A pair of electrode patterns is formed by using the metal mask with an opening having a width of 0.3 mm, 0.5 mm, or 0.7 mm. In consideration of the amount of the material deposited even under the mask, the interval between the terminal electrode 26 and the terminal electrode 53 is preferably 0.3 mm or more. In FIG. 5, the vertical axis is the fixing strength while the horizontal axis means the total area of the pair of electrodes. As FIG. 5 indicates, it is understood that each sample has sufficient fixing strength as the terminal electrode because the samples have the fixing strength of more than 5N.

Moreover, although the present embodiment mode shows the example where the terminal electrode is formed by the sputtering method using the metal mask, the present invention is not limited to this. For example, the terminal electrode may be formed by the screen printing method using Ni paste.

Figure 2C:
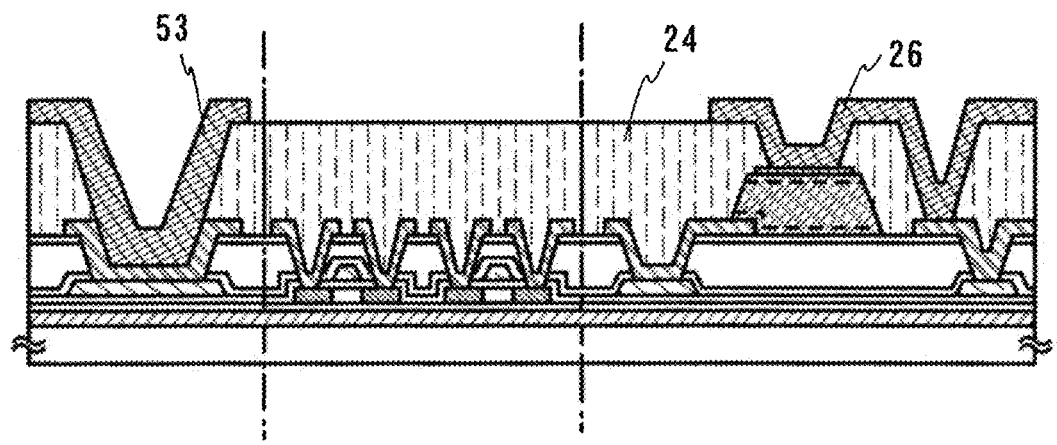

According to the above processes, the terminal electrodes 26 and 53 that can be soldered are formed and the structure shown in FIG. 2C is obtained. The seven photo masks and one metal mask, which are the eight masks in total, can manufacture the photo sensor and the amplifier circuit.

Next, an adhesion material that is soluble in water or alcohols is applied all over the surface and calcined. This adhesion material may have any composition such as epoxy, acrylic, or silicone. Here, a film 74 made of water-soluble resin (VL-WSHL10 manufactured by Toagosei Co., Ltd) having a thickness of 30 μm is applied by spin coating and exposed for 2 minutes in order to temporarily cure the film 74. Then, the film is exposed to UV rays from its rear surface for 2.5 minutes and from its surface for 10 minutes, which means 12.5 minutes in total, so that it is cured completely. This water-soluble resin film works as a planarizing film. Accordingly, when the substrate is pasted thereto in the following step, they can be pasted so that the surface of the planarizing film and the surface of the substrate become almost parallel. Without this water-soluble resin film, convexity and concavity due to the electrode or the TFT may appear when being crimped.

The adhesiveness between the metal film 71 and the metal oxide film or the adhesiveness between the metal oxide film and the oxide film is partially lowered in order to perform the following peeling step easily. To lower the adhesiveness partially, the laser light is irradiated partially to the metal oxide film along the rim of the region to be peeled or the pressure is applied locally from the outside along the rim of the region to be peeled in order to damage partially the metal oxide film or a part of the interface thereof. Specifically, a hard needle such as a diamond pen may be pressed vertically and may be moved while applying load thereto. It is preferable to use a scriber apparatus and to move the hard needle in the range form 0.1 to 2 mm while applying the pressure. Thus, it is important to form a portion where the peeling is likely to occur, which is a trigger, before the peeling step. By lowering the adhesiveness selectively (partially) in advance, the defective peeling can be prevented and the yield can be increased.

Next, a two-sided tape 73 is used to paste a second substrate 72 to the film 74 formed of the water-soluble resin. Moreover, a two-sided tape 75 is used to paste the third substrate 76 to the first substrate 70. The third substrate 76 prevents the first substrate 70 from being damaged in the following peeling step. It is preferable that the second substrate 72 and the third substrate 76 are a quartz substrate or a semiconductor substrate, which is more rigid than the first substrate 70. Not only the two-sided tape but also an adhesive material can be used. For example, an adhesive material that is peeled by the ultraviolet ray radiation may be used.

Figure 3A:
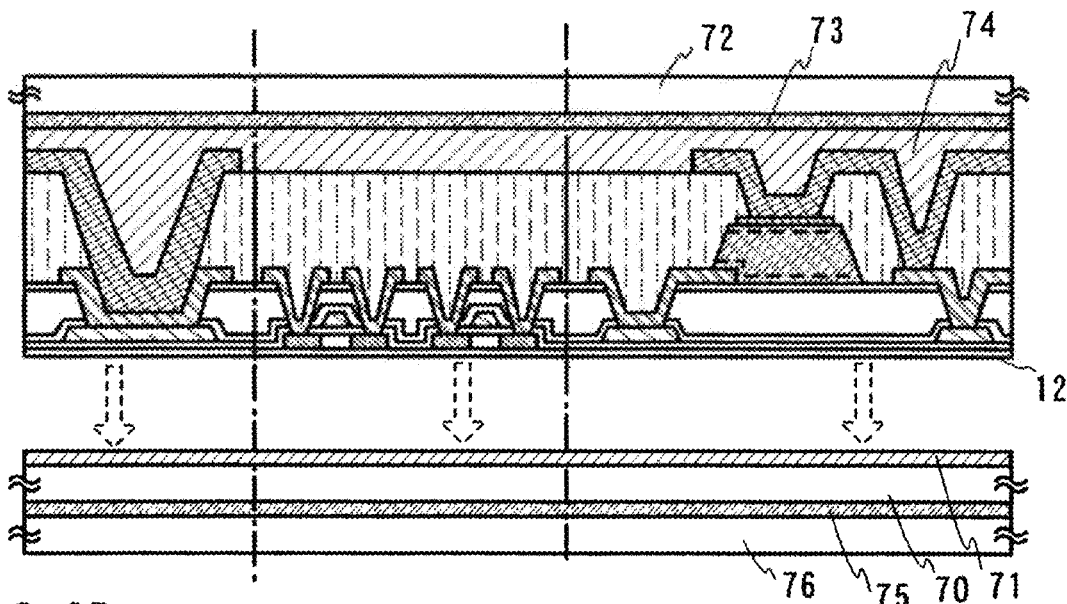
FIGS. 3A to 3C are cross-sectional views for showing the manufacturing process of the photo sensor device.
Figure 3B:
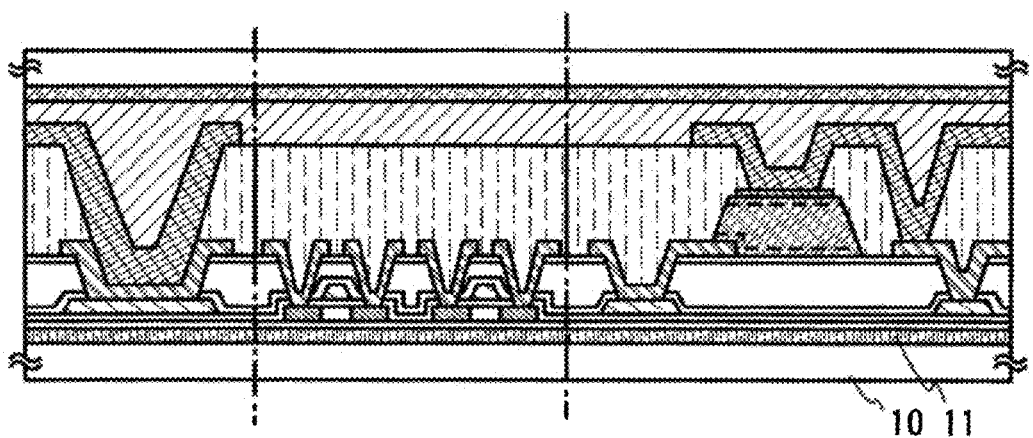

Next, the first substrate 70 with the metal film 71 formed is peeled by physical means from the side of the region where the adhesiveness is partially lowered. It can be peeled by a comparatively small force (for example hand power, air pressure of gas blown from a nozzle, ultrasonic waves, or the like). Thus, the film to be peeled formed over the silicon oxide layer 12 can be separated from the first substrate 70. FIG. 3A shows the state after being peeled.

After the peeling, $WO_2$ is all left on the first substrate, ⅓ of $WO_3$ is left on the first substrate, and ⅔ of $WO_3$ is left on the layer to be peeled. The peeling is likely to occur from the inside of the tungsten oxide film, particularly the interface between $WO_2$ and $WO_x$, or the interface between $WO_2$ and $WO_3$. Although the tungsten oxide film is partially left on the layer to be peeled, it is not always necessary to remove it because the tungsten oxide film is transparent. It is removed in this embodiment mode.

Thus, a circuit including the TFT having high electrical characteristic typified by field-effect mobility, which seems to be obtained only on the glass substrate, can be transferred to the film substrate directly.

Next, the fourth substrate 10 and the oxide layer 12 (and the layer to be peeled) are pasted by an adhesive material 11. (FIG. 3B) It is necessary that the adhesive material 11 to paste the oxide layer 12 (and the layer to be peeled) and the fourth substrate has higher adhesiveness than the two-sided tape 73 to paste the second substrate 72 and the layer to be peeled.

As a material of the adhesive material 11, there are a reaction-curing adhesive material, a thermosetting adhesive material, a photo-curing adhesive material such as a UV-cure adhesive material, an anaerobic adhesive material, and the like.

Figure 3C:
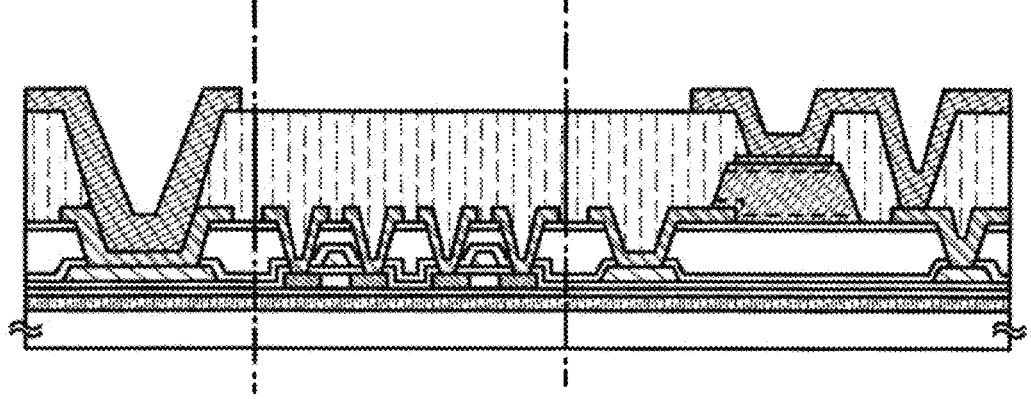

Next, the second substrate 72 is separated from the two-sided tape 73. Then, the two-sided tape 73 is peeled. Moreover, the water-soluble resin 74 is removed by dissolving it using the water. (FIG. 3C)

According to the above processes, the amplifier circuit and the photo sensor element consisting of the TFT transferred to the plastic substrate 10 can be obtained.

Subsequently, a plurality of photo sensor chips is separated by cutting it with the use of a $CO_2$ laser or a dicer. Since the substrate with the photo sensor element provided is a film substrate, it can be cut comparatively easily. A large amount of photo sensor chips (each having a size of 2 mm×1.5 mm) can be manufactured from a large substrate (for example having a size of 600 mm×720 mm).

Figure 4A:
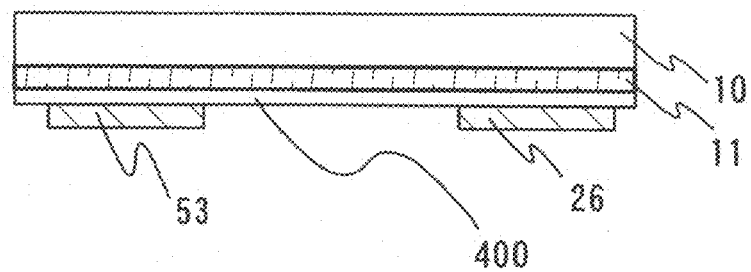
FIG. 4A is a cross-sectional view of the photo sensor of the present invention.
Figure 4B:
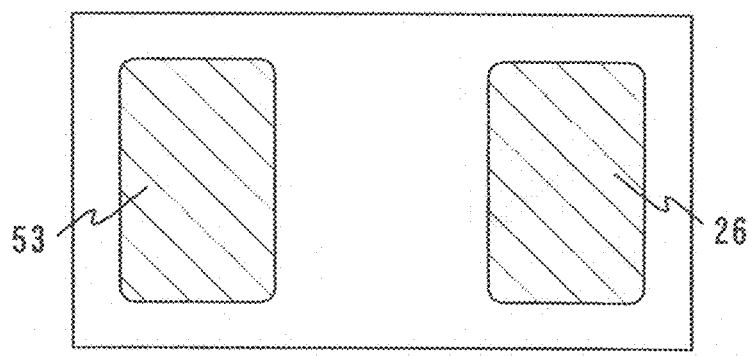
FIG. 4B is a bottom view of the photo sensor of the present invention.
Figure 4C:
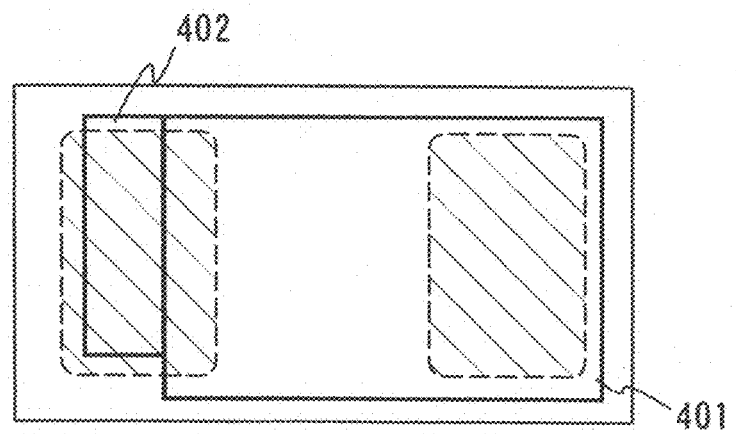
FIG. 4C is a top view of the photo sensor of the present invention.
Figure 4D:
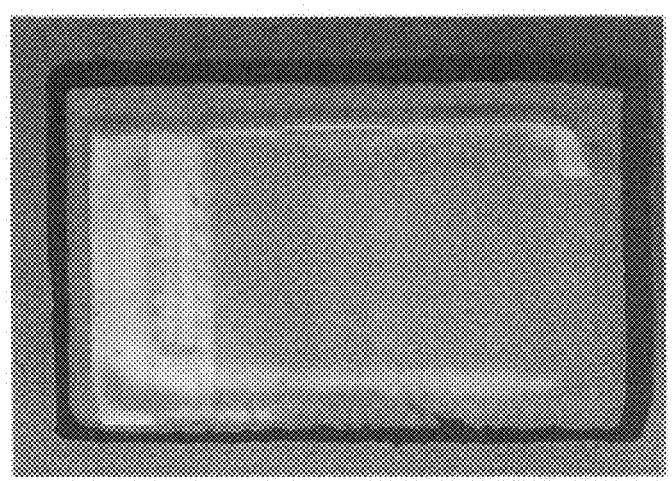
FIG. 4D is a photograph of the photo sensor of the present invention.

FIG. 4A is a cross-sectional view of one photo sensor chip (2 mm×1.5 mm), FIG. 4B is a bottom view thereof, and FIG. 4C is a top view thereof. FIG. 4D is a photograph showing the appearance of the photo sensor chip observed from above. The same reference numeral as that shown in FIGS. 1A to 3C is given to the same part in FIGS. 4A to 4D.

In FIG. 4A, the total thickness of the substrate 10, the adhesion layer 11, the element-forming region 400, and the electrodes 26 and 53 is 0.25±0.05 mm. In addition, in FIG. 4B, each of the terminal electrodes 26 and 53 has a size of 0.6 mm×1.1 mm, and the electrode interval is 0.4 mm. In FIG. 4C, the square measure of the light-receiving portion 401 is almost equal to the square measure of the second electrode, which is 1.57 $mm^2$. The amplifier circuit portion 402 has approximately 100 TFTs.

Finally, the obtained photo sensor chip is mounted in a print wiring substrate 60. To connect the terminal electrodes 26 and 53 with the electrodes 61 and 62, solder is formed in advance on the electrodes 61 and 62 of the print wiring substrate 60 by the screen printing method or the like. Then, after the solder and the terminal electrodes are connected, a solder reflow process is performed to mount the photo sensor chip in the print wiring substrate 60. The solder reflow process is performed for approximately 10 seconds at temperatures ranging from 255 to 265° C. under an inert gas atmosphere. Therefore, it is preferable that the substrate 10 is the film substrate that can resist the temperature of 260° C. or more in this solder reflow process. The HT substrate used as the substrate 10 is a plastic substrate having a sheet shape made of the material in which an inorganic particle having a diameter of approximately several nm is diffused into an organic polymer matrix. The HT substrate has a glass-transition temperature Tg of 400° C. or more, and it has enough resistance against the solder reflow process. Moreover, not only the solder but also a bump made of metal (gold, silver, or the like) or a bump made of conductive resin can be used. In addition, lead-free solder may be used in consideration of an environmental problem.

FIG. 1A shows the photo sensor chip mounted through the above processes.

Figure 6:
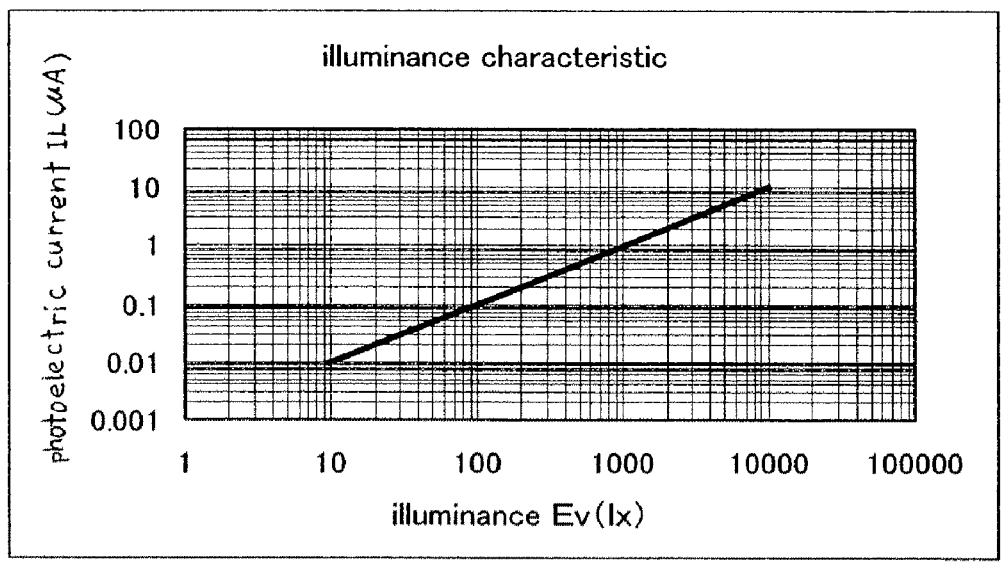
FIG. 6 is a graph for showing the illuminance characteristic.

FIG. 6 is a graph showing the illuminance characteristic of the photo sensor. In FIG. 6, the vertical axis shows the amount of photoelectric current IL (μA) and the horizontal axis shows the illuminance Ev (lx). In the photo sensor of the present invention shown in FIG. 6 (the photo sensor with the circuit integrated where an amplifier circuit for multiplying the output value by 100 times is equipped), a photoelectric current of approximately 10 μA can be obtained at the illuminance of 10 lux.

Figure 11:
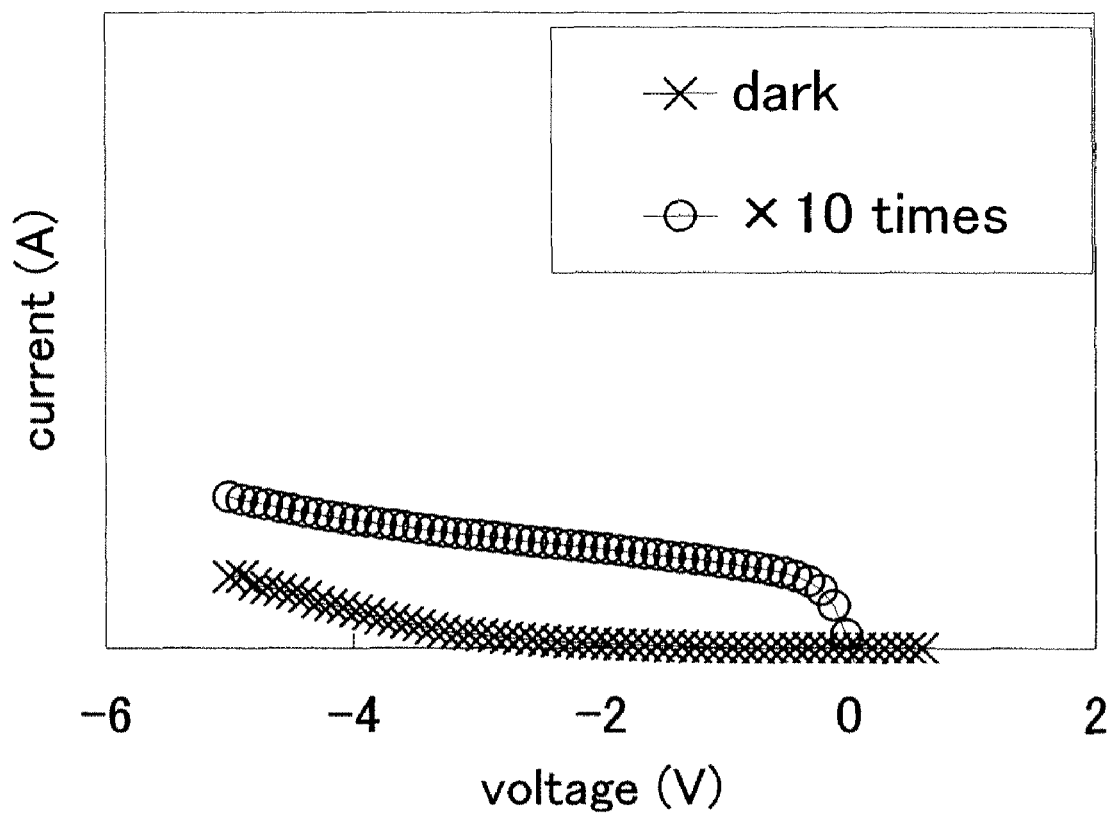
FIG. 11 is a graph for showing the electrical characteristic (I-V characteristic) of the photo sensor with the circuit integrated having the amplifier circuit for decoupling the output value.

FIG. 11 shows the electrical characteristic (I-V characteristic) of the photo sensor with the circuit integrated where an amplifier circuit for multiplying the output value by 10 times is equipped. In order to multiplying the output value by 10 times, two n-channel TFTs 30 (channel size L/W=8 μm/50 μm) and twenty n-channel TFTs 31 (channel size L/W=8 μm/50 μm) are provided. Since when the amplifier circuit has different multiple, the output value changes depending on the multiple, it is understood that the amplifier circuit (10 times) functions. In FIG. 11, the voltage indicated by the horizontal axis corresponds to a power supply potential connected to the TFT side in the circuit diagram (FIG. 1B) and the potential on the side of the first electrode of the photo sensor corresponds to 0 (V). It is noted that the current value indicated by the vertical axis is the output of the photo sensor.

The present invention having the above structure is explained in detail in the following embodiment.

Embodiment 1

Figure 7A:
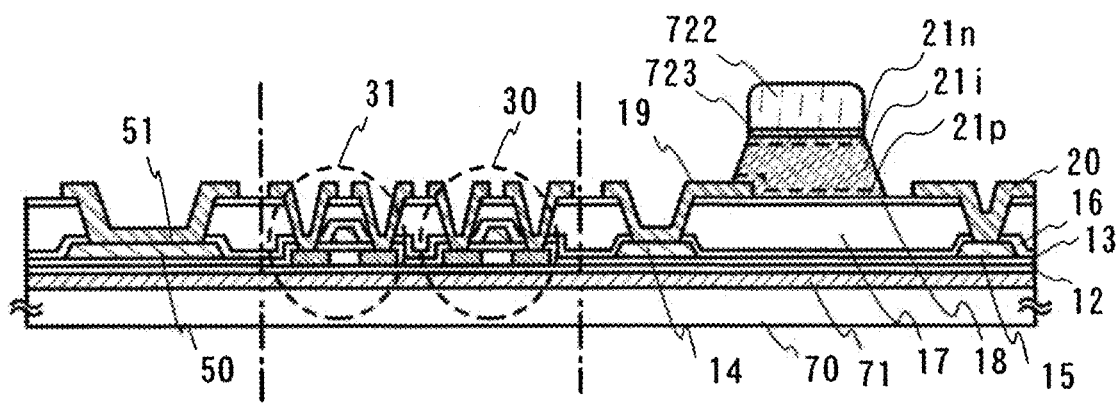
FIGS. 7A and 7B are cross-sectional views for showing the manufacturing process of the photo sensor explained in embodiment 1.
Figure 7B:
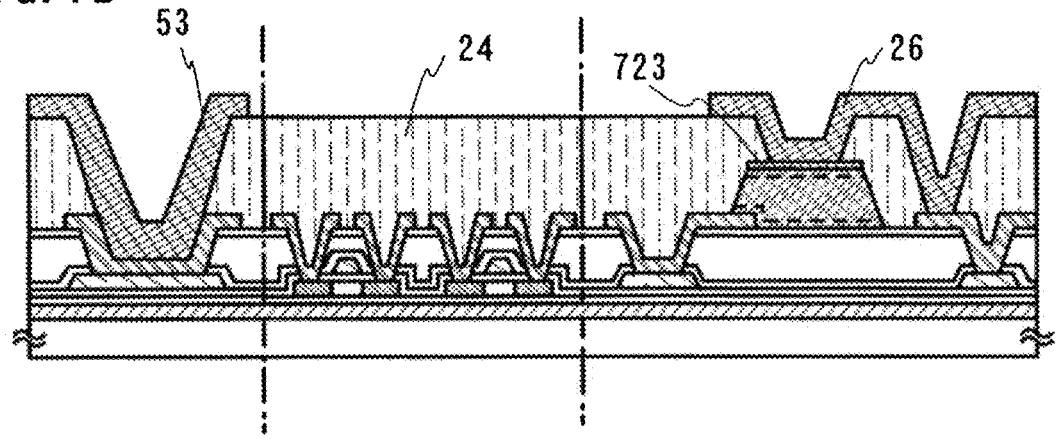

This embodiment explains a manufacturing process that is partially different from that shown in the embodiment mode with reference to FIGS. 7A and 7B. It is noted that the same reference numeral as that in FIGS. 1A to 3C is given to the same part in FIGS. 7A and 7B except for the second electrode.

Initially, the processes up to forming the photoelectric conversion layer and forming the metal film to become the second electrode afterward are performed according to the embodiment mode.

In order to decrease the number of masks and processes, in this embodiment, after forming a second electrode 723 made of Ti, etching gas is changed, and the photoelectric conversion layer including the amorphous silicon film is etched in a self-aligning manner using a resist mask 722 used for forming the second electrode 723. The cross-sectional view of this process is shown in FIG. 7A.

When the photoelectric conversion layer is patterned, since the top surface of the first electrode 19 is Ti, the first electrode 19 works as an etching stopper, and the insulating film 18 also works as the etching stopper.

Next, the resist mask 722 is removed and the sealing resin 24 is formed. Then, after forming a contact hole, the terminal electrodes 26 and 53 are formed as well as in the embodiment mode. (FIG. 7B)

Since the following steps are the same as those in the embodiment mode, the explanation is omitted here.

Thus, six photo masks and a metal mask, which are seven masks in total, can manufacture the photo sensor and the amplifier circuit.

Since they are formed in a self-aligning manner, the area of the second electrode can be slightly enlarged compared with the embodiment mode.

The present embodiment can be combined with the embodiment mode.

Embodiment 2

Figure 8A:
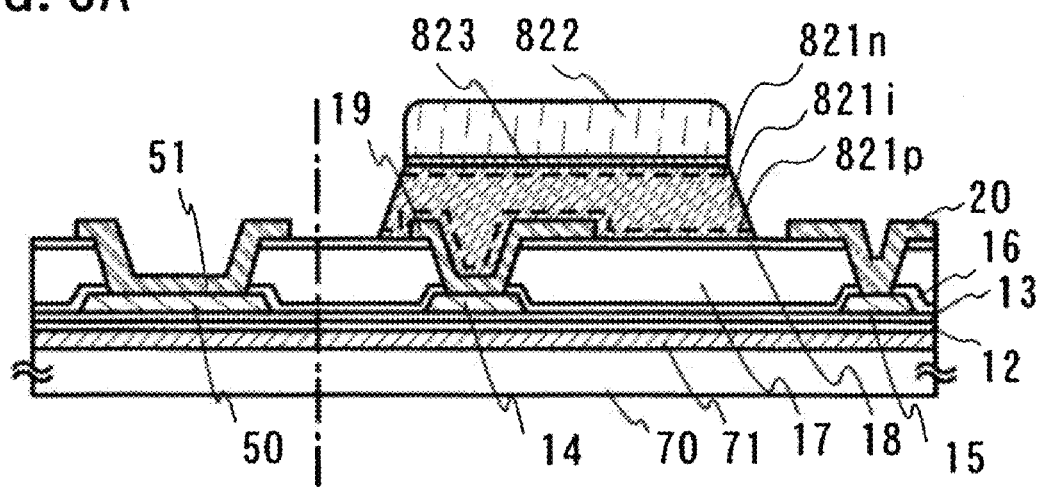
FIGS. 8A and 8B are cross-sectional views for showing the manufacturing process of the photo sensor explained in embodiment 2.
Figure 8B:
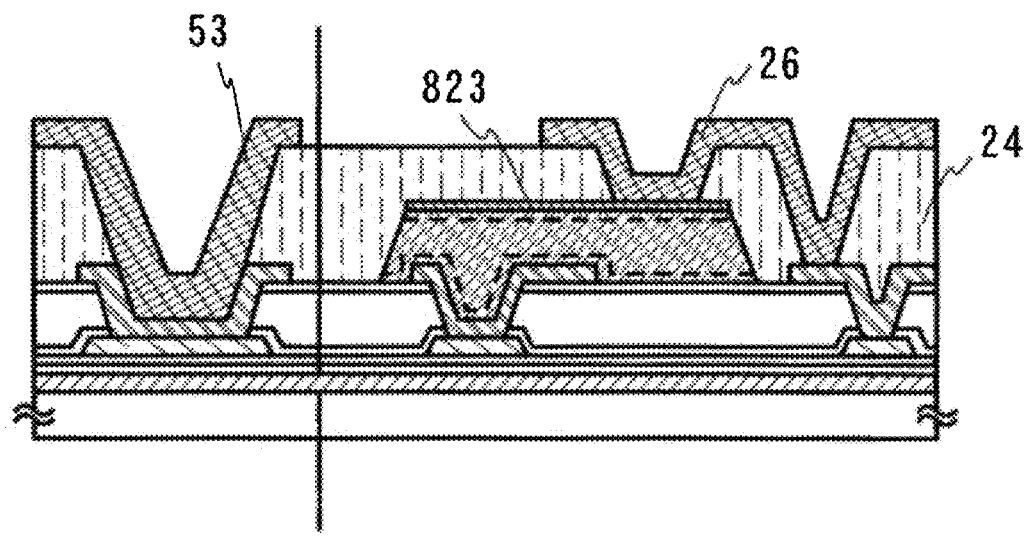
Figure 9:
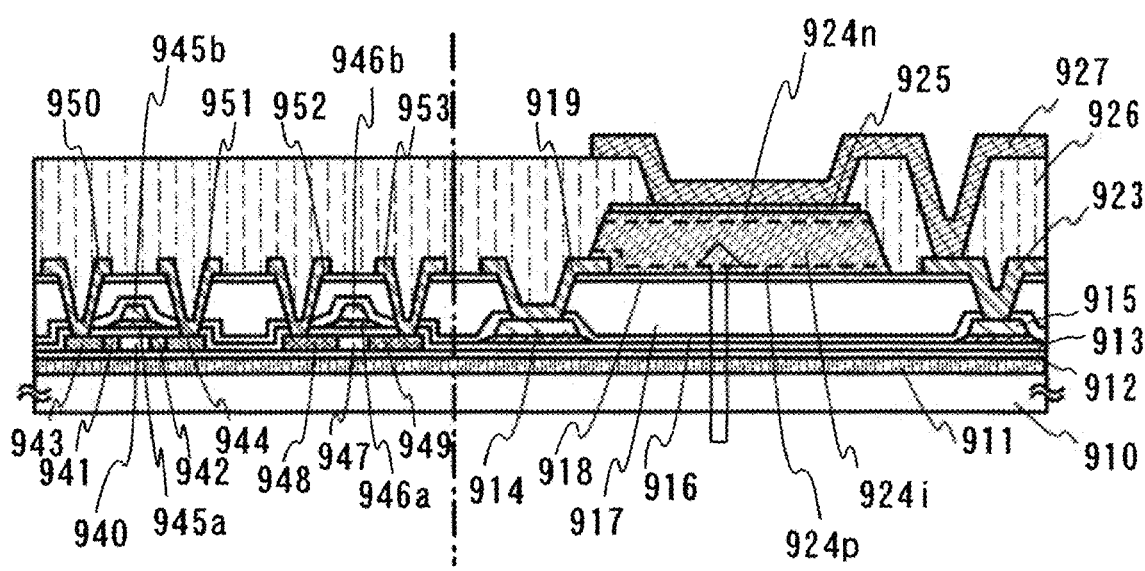
FIG. 9 is a cross-sectional view for showing the manufacturing process of the photo sensor explained in embodiment 3.

This embodiment shows a manufacturing process with reference to FIGS. 8A and 8B in which the second electrode pattern is different from that shown in the embodiment mode. The same reference numeral as that in FIGS. 1A to 3C is given to the same part in FIGS. 8A and 8B except for the second electrode pattern. Although FIGS. 8A and 8B don't show the amplifier circuit, it is formed as well as in the embodiment mode.

Initially, the processes up to forming the photoelectric conversion layer and forming the metal film to become the second electrode afterward are performed according to the embodiment mode.

In order to decrease the number of masks and processes, in this embodiment, after forming a second electrode 823 made of Ti, etching gas is changed, and then a photoelectric conversion layer including an amorphous silicon film is etched in a self-aligning manner using the resist mask 822 used for forming the second electrode 723. FIG. 8A shows the cross-sectional view of this process.

The second electrode 823 has a pattern shape to cover the first electrode 19 completely. The photoelectric conversion layer formed in a self-aligning manner with the second electrode 823 also has a pattern shape to cover the first electrode 19 completely.

Next, a resist mask 822 is removed and the sealing resin 24 is formed. Then, after forming a contact hole, the terminal electrodes 26 and 53 are formed as well as in the embodiment mode. (FIG. 8B)

Since the following steps are the same as those in the embodiment mode, the explanation is omitted here.

Thus, the area of the second electrode can be enlarged compared with the embodiment mode.

Six photo masks and a metal mask, which are seven masks in total, can manufacture a photo sensor and an amplifier circuit.

The present embodiment can be combined with the embodiment mode freely.

Embodiment 3

In contrast with the above embodiment showing the example of the amplifier circuit using only the n-channel TFT, this embodiment shows an example of an operational amplifier using a plurality of n-channel TFTs and p-channel TFTs.

Initially, a first photo mask is used to form a resist mask and etching is performed so that an island-shaped semiconductor layer is formed as well as in the embodiment mode. In this step, the island-shaped semiconductor layer is formed on the tungsten film and the base insulating film 912 over the glass substrate.

Next, a small amount of impurity element (boron or phosphorus) is doped if necessary in order to control the threshold of the TFT. Here, the ion-doping method is performed in such a way that diborane ($B_2H_6$) is excited to be plasma and it is added to the island-shaped semiconductor layer without mass-separation.

Next, the surface of the silicon film is washed at the same time as removing the oxide film by the etchant including hydrofluoric acid. After that, an insulating film mainly including silicon to become a gate insulating film 913 is formed.

Next, a first conductive film having a thickness from 20 to 100 nm and a second conductive film having a thickness from 100 to 400 nm are formed on the gate insulating film. In this embodiment, a tantalum nitride film having a thickness of 50 nm and a tungsten film having a thickness of 370 nm are laminated sequentially over a gate insulating film 913, and each gate electrode and each wiring are formed by patterning according to the procedure shown below.

The first conductive film and the second conductive film are formed of an element selected from the group consisting of Ta, W, Ti, Mo, Al, and Cu, or formed of an alloy material or a chemical compound material mainly including the above element. In addition, a semiconductor film typified by a polycrystalline silicon film with the impurity element such as phosphorus doped or an AgPdCu alloy can be used as the first and the second conductive films. Moreover, the conductive film may be formed not only in two-layer structure but also in three-layer structure in which a tungsten film having a thickness of 50 nm, an aluminum and silicon (Al—Si) alloy film having a thickness of 500 nm, and a titanium nitride film having a thickness of 30 nm are laminated sequentially. In the three-layer structure, a tungsten nitride film may be used instead of the tungsten film as the first conductive film, an aluminum and titanium (Al—Ti) alloy film may be used instead of the Al—Si alloy film as the second conductive film, and a titanium film may be used instead of the titanium nitride film as the third conductive film. Furthermore, the conductive film may have a single-layer structure.

An ICP (Inductively Coupled Plasma) etching method may be employed to etch the first and the second conductive films (the first and the second etching processes). The films can be etched so as to have a desired tapered shape by using the ICP etching method and by changing the etching condition (the electrical quantity applied to a coil electrode, the electrical quantity applied to an electrode on the substrate side, the temperature of the electrode on the substrate side, and the like) appropriately. After a resist mask is formed, the etching process is performed under the first etching condition in which $CF_4$, $Cl_2$, and $O_2$ are used as the etching gas at a gas flow rate of 25/25/10 (sccm) respectively and 700 W RF (13.56 MHz) electric power is applied to the coil electrode at a pressure of 1 Pa. 150 W RF (13.56 MHz) electric power is also applied to the substrate side (sample stage), and substantially negative self-bias voltage is impressed. It is noted that the electrode on the substrate side has a size of 12.5 cm×12.5 cm. The coil electrode (herein means a quartz circular plane with the coil provided) is a circular plane having a diameter of 25 cm. The W film is etched under the first etching condition, and the edge portions thereof are made into a tapered shape. Next, the etching process is performed under the second etching condition without removing the resist mask. In the second etching condition, $CF_4$ and $Cl_2$ are used as the etching gas at a gas flow rate of 30/30 (sccm) respectively and plasma is generated by applying 500 W RF (13.56 MHz) to the coil electrode at a pressure of 1 Pa. Then the etching process is performed for approximately 30 seconds. 20 W RF (13.56 MHz) electric power is also applied to the substrate side (sample stage), and thereby substantially negative self-bias voltage is impressed. Under the second etching condition using the mixed gas of $CF_4$ and $Cl_2$, the W film and the TaN film are both etched to the same extent. It is noted that the first etching condition and the second etching condition are referred to as the first etching process.

Next, a second etching process is performed without removing the resist mask. The etching process is performed under a third etching condition in which $CF_4$, and $Cl_2$ are used as the etching gas at a gas flow rate of 30/30 (sccm) respectively and plasma is generated by applying 500 W RF (13.56 MHz) electric power to the coil electrode at a pressure of 1 Pa. Thus, the etching is performed for approximately 60 seconds. 20 W RF (13.56 MHz) electric power is also applied to the substrate side (sample stage), and thereby substantially negative self-bias voltage is impressed. After that, the etching is performed without removing the resist mask under a fourth etching condition where $CF_4$, $Cl_2$, and $O_2$ are used as the etching gas at a gas flow rate of 20/20/20 (sccm) respectively, and plasma is generated by applying 500 W RF (13.56 MHz) electric power to the coil electrode at a pressure of 1 Pa. The etching is performed for approximately 20 seconds. 20 W RF (13.56 MHz) electric power is also applied to the substrate side (sample stage), and substantially negative self-bias voltage is impressed. It is noted that the third etching condition and the fourth etching condition are referred to as the second etching process. In this step, the gate electrode, the wirings 914 and 915, and the terminal electrode (not shown diagrammatically) having the first conductive layers 945a and 946a as the lower layer and the second conductive layers 945b and 946b as the upper layer are formed.

Next, after removing the resist mask, a first doping process for doping all over the surface is performed using the gate electrode as a mask. The first doping process may be performed by the ion doping method or the ion injection method. The ion doping method is performed under the condition where the dose is $1.5 \times 10^{13}$ ions/cm and the accelerating voltage is in the range of 50 to 100 keV. As the impurity element imparting n-type, typically phosphorus (P) or arsenic (As) is used. A first impurity region (n⁻ region) is formed in a self-aligning manner.

Next, a resist mask is newly formed in order to protect a channel-forming region and its vicinity of the semiconductor layer forming the p-channel TFT of the driver circuit.

Next, the resist mask is used to perform a second doping process selectively. In the second doping process, impurity regions (n⁻ region) 941 and 942 that are overlapped with a part of the gate electrode and high-concentrated impurity regions 943 and 944 are formed. The second doping process may be performed by the ion doping method or the ion injection method. In this embodiment, the ion doping method is used under the condition where the flow rate of the gas in which phosphine ($PH_3$) is diluted with hydrogen so that the concentration of the phosphine is 5% is 40 sccm, the dose is $3 \times 10^{15}$ ions/cm², and the accelerating voltage is 65 keV. In this case, the resist mask and the second conductive layer become the mask against the impurity element imparting n-type, thereby forming the second impurity regions 941 and 942. The impurity element imparting n-type is added to the second impurity region at concentration ranging from $1 \times 10^{16}$ to $1 \times 10^{17}$/cm³. The region having the same concentration as the second impurity region is also referred to as the n⁻ region. The impurity element imparting n-type is added to the third impurity regions 943 and 944 at concentration ranging from $1 \times 10^{20}$ to $1 \times 10^{21}$/cm³. In this embodiment, the region having the same concentration as the third impurity region is also referred to as an n⁺ region.

Next, after removing the resist mask, a resist mask is newly formed and a third doping process is performed. The third doping process forms fourth impurity regions 948 and 949 in which the impurity element imparting p-type conductivity is added to the semiconductor layer forming the p-channel TFT.

It is noted that the impurity element imparting p-type is added in the fourth impurity regions 948 and 949 at concentrations ranging from $1 \times 10^{20}$ to $1 \times 10^{21}$/cm³. It is noted that although the fourth impurity regions 948 and 949 are the regions (n⁻ region) with phosphorus (P) added in the previous step, the conductivity is p-type because the concentration of the impurity element imparting p-type is 1.5 to 3 times higher than that of the impurity element imparting n-type. The region having the same concentration as the fourth impurity region is also referred to as a p⁺ region.

The above processes form the impurity region in which the respective semiconductor layers have the n-type or p-type conductivity.

Next, an insulating film (not shown diagrammatically) for covering almost all over the surface is formed. In this embodiment, a silicon oxide film having a thickness of 50 nm is formed by a plasma CVD method. The insulating film is not limited to the silicon oxide film and another insulating film including silicon may be used in a single-layer structure or a laminated-layer structure.

Next, the process for activating the impurity element added in the respective semiconductor layers is performed.

Then, a first interlayer insulating film 916 including a silicon nitride film is formed, and a heat treatment (at temperatures ranging from 300 to 550° C. for 1 to 12 hours) is performed to hydrogenate the semiconductor layers. This process is to terminate the dangling bond of the semiconductor layers using hydrogen included in the first interlayer insulating film 916.

Next, a second interlayer insulating film 917 is formed of an organic insulating material on the first interlayer insulating film 916. In this embodiment, the second interlayer insulating film 917 is formed of acrylic resin in 1.6 μm thick by a coating method and a third interlayer insulating film 918 formed of a silicon nitride film having a thickness of 300 nm is formed thereon by a sputtering method.

Next, the interlayer insulating films 916 to 918 are etched selectively to form a contact hole. Specifically electrodes 950 to 953 to become a source wiring or a drain electrode, a connection electrode 923, a first electrode 919, and the like are formed. In this embodiment, these electrodes and wirings are formed by patterning laminated layers of a Ti film (thickness 100 nm), an Al film including silicon (thickness 350 nm), and a Ti film (thickness 50 nm).

As thus described, the n-channel TFT, the p-channel TFT, and the first electrode 919 can be manufactured.

The n-channel TFT has a channel-forming region 940 as an active layer, the low-concentrated impurity regions 941 and 942, and the high-concentrated impurity regions 943 and 944. Moreover, the gate electrodes 945*a* and 945*b* having the two-layer structure overlap the channel-forming region 940 through the gate insulating film 913. Moreover, the gate electrode 945*a* having broader width than the gate electrode 945*b* overlaps the low-concentrated impurity region, which is the GOLD structure. The high-concentrated impurity regions 943 and 944 are the source region or the drain region, and reference numerals 950 and 951 denote the source electrode or the drain electrode.

The p-channel TFT has a channel-forming region 947 as an active layer and source or drain regions 948 and 949. Moreover, the gate electrodes 946*a* and 946*b* having the two-layer structure overlap the channel-forming region 947 through the gate insulating film 913. Reference numerals 952 and 953 denote the source electrode or the drain electrode.

An operational amplifier can be formed by combining the n-channel TFT and p-channel TFT obtained thus appropriately. In the case of forming the operational amplifier, since a power supply of VBB is necessary in addition to the high potential power supply VDD and the low potential power supply VSS, the number of terminals is five. Therefore, it is preferable to form a level shift circuit. The level shift circuit can decrease the number of power supplies to four. In the sensor chip, it is preferable to form a connection electrode terminal at four points on the chip and to mount it on the print substrate or the like in terms of its strength. In order to reduce the variation, feedback resistance is provided to convert the output current of the photodiode into the voltage, and the voltage may be taken out as the voltage output from the output terminal.

Although the present embodiment explains the operational amplifier as the amplifier circuit, the amplifier circuit is not limited to the operational amplifier.

After that, the photoelectric conversion layers 924*p*, 924*i*, and 924*n*, the second electrode 925, the sealing resin 926, and the terminal electrode 927 are formed and peeled to transfer these elements to the film substrate 910 according to the embodiment mode of the present invention. The film substrate 910 is adhered by the adhesion layer 911. After transferring, the film substrate may be separated and a photo sensor chip may be formed and mounted appropriately.

The present embodiment can be freely combined with the embodiment mode, the embodiment 1, or the embodiment 2.

Embodiment 4

Various electronic apparatus can be manufactured by incorporating the photo sensor chip manufactured by the present invention. As the electronic apparatuses, there are a video camera, a digital camera, a goggle type display (head mount display), a projector, a navigation system, a sound reproduction system (car audio, audio compo, and the like) a note-type personal computer, a game machine, a terminal device (a mobile computer, a mobile phone, a mobile game machine, an electronic book, and the like), an image reproduction device with a recording medium equipped (specifically a device for playing the recording medium such as DVD (Digital Versatile Disc) and for displaying the image), and the like.

This embodiment shows an example in which the photo sensor of the present invention is incorporated in the terminal device typified by the mobile phone and PDA.

In recent years, the power consumption of the illumination lamp such as the backlight tends to increase because the information equipment such as the mobile phone and PDA have began to display using various colors and because the quality of the motion picture thereof has been enhanced. On the other hand, it has been demanded to reduce the power consumption without deteriorating the quality of the display. Consequently, in order to reduce the power consumption, the luminance of the display device is controlled or the illumination of the key switch is controlled by detecting the illuminance of the environment where the terminal device is used.

Figure 10A:
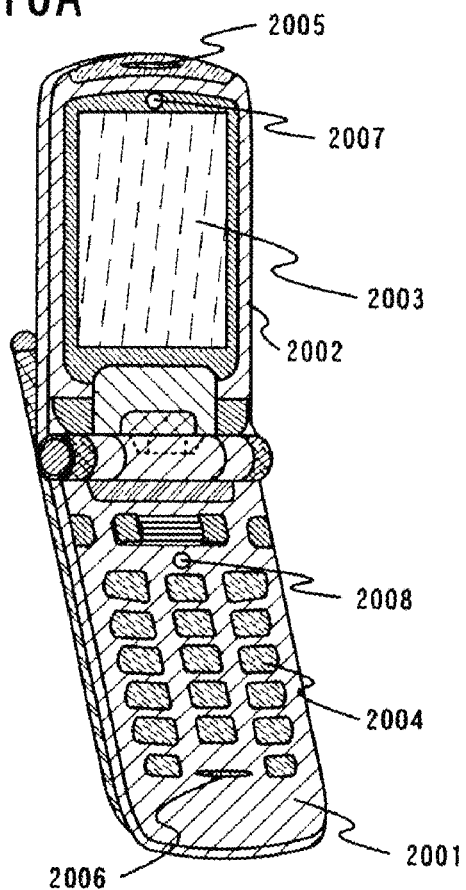
FIGS. 10A and 10B are the drawings for showing the electronic apparatus.

FIG. 10A is a mobile phone including a main body 2001, a chassis 2002, a display portion 2003, an operation key 2004, a voice output portion 2005, a voice input portion 2006, photo sensors 2007 and 2008, and the like. The present invention can be applied to the photo sensors 2007 and 2008. The luminance of the display portion 2003 is controlled in accordance with the illuminance obtained by the photo sensor 2007, and the illumination of the key switch 2004 is controlled in accordance with the illuminance obtained by the photo sensor 2008. Thus, the power consumption of the mobile phone can be reduced.

In the case of an imaging device such as a digital camera or a digital video camera, a sensor for detecting the visible light is provided near the eyepiece (view port) of the optical finder and for detecting whether the photographer views the optical finder or not. For example, when the photographer approaches the eyepiece of the finder, the shadow of the photographer covers the eyepiece and its vicinity. Therefore, the change of the amount of the light to be received by the sensor is used for the detection.

Figure 10B:
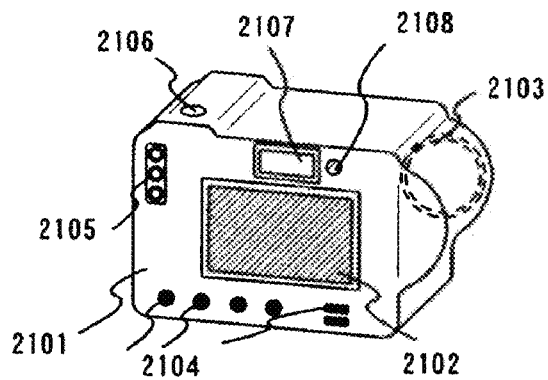

FIG. 10B is a digital camera including a main body 2101, a display portion 2102, an image receiver 2103, an operational key 2104, an external connection port 2105, a shutter 2106, a finder 2107, an photo sensor 2108, and the like. The present invention is applied to the photo sensor 2108. Whether or not the photographer views the optical finder is detected by the change of the amount of the light to be received by the sensor 2108 provided near the finder 2107. When the photographer views the optical finder, the display portion 2102 is turned off so that the power consumption can be reduced.

The photo sensor element of the present invention can be used for adjusting the convergence of the projector.

The present embodiment can be freely combined with the embodiment mode, the embodiment 1, the embodiment 2, and the embodiment 3.

A single-crystal silicon substrate has its limit in size and the mass productivity is limited. However, when the glass substrate or the plastic substrate, which are less expensive than the single-crystal silicon substrate, are used according to the present invention, the size of the substrate can be enlarged. For example, the substrate can have the size of 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm. With the large substrate, the mass production is enhanced and the manufacturing cost per one product can be reduced.

What is claimed is:

1. A method for manufacturing a semiconductor device comprising a chip having a photo sensor element and an amplifier circuit comprising the steps of:
   forming a thin film transistor in the amplifier circuit;
   forming an interlayer insulating film over the thin film transistor;
   forming a first electrode over the interlayer insulating film at the same time as forming a source electrode or a drain electrode connected to a source region or a drain region of the thin film transistor;
   forming the photo sensor element by laminating a first crystalline semiconductor film having a first conductivity, an amorphous semiconductor film, and a second crystalline semiconductor film having a second conductivity over the first electrode and the interlayer insulating film; and
   forming a second electrode over the second crystalline semiconductor film having the second conductivity,
   wherein an end portion of the first electrode is covered with the first crystalline semiconductor film having the first conductivity.

2. The method for manufacturing the semiconductor device according to claim 1, wherein the thin film transistor in the amplifier circuit includes a semiconductor film having a crystal structure.

3. The method for manufacturing the semiconductor device according to claim 1, wherein the chip having the photo sensor element and the amplifier circuit is mounted in a print wiring substrate by a solder reflow process.

4. The method for manufacturing the semiconductor device according to claim 1, wherein an external terminal of the chip has a two-terminal structure.

5. The method for manufacturing the semiconductor device according to claim 1, wherein the amplifier circuit comprises a current mirror circuit.

6. A method for manufacturing a semiconductor device comprising a chip having a photo sensor element and an amplifier circuit comprising the steps of:
   forming a thin film transistor in the amplifier circuit over a first substrate;
   forming an interlayer insulating film over the thin film transistor;
   forming a first electrode over the interlayer insulating film at the same time as forming a source electrode or a drain electrode connected to a source region or a drain region of the thin film transistor;
   forming the photo sensor element by laminating a first crystalline semiconductor film having a first conductivity, an amorphous semiconductor film, and a second crystalline semiconductor film having a second conductivity over the first electrode and the interlayer insulating film;
   forming a second electrode over the second crystalline semiconductor film having the second conductivity;
   separating a layer including the photo sensor element and the amplifier circuit from the first substrate; and
   transferring the layer including the photo sensor element and the amplifier circuit to a second substrate,
   wherein an end portion of the first electrode is covered with the first crystalline semiconductor film having the first conductivity.

7. The method for manufacturing the semiconductor device according to claim 6, wherein the thin film transistor in the amplifier circuit includes a semiconductor film having a crystal structure.

8. The method for manufacturing the semiconductor device according to claim 6, wherein the chip having the photo sensor element and the amplifier circuit is mounted in a print wiring substrate by a solder reflow process.

9. The method for manufacturing the semiconductor device according to claim 6, wherein an external terminal of the chip has a two-terminal structure.

10. The method for manufacturing the semiconductor device according to claim 6, wherein the amplifier circuit comprises a current mirror circuit.

11. The method for manufacturing the semiconductor device according to claim 6, wherein the second substrate is a plastic film substrate.

12. The method for manufacturing the semiconductor device according to claim 6, further comprising separating the layer including the photo sensor element and the amplifier circuit from the second substrate.

13. A method for manufacturing a semiconductor device comprising a chip having a photo sensor element and an amplifier circuit comprising the steps of:

forming a thin film transistor in the amplifier circuit over a first substrate;

forming an interlayer insulating film over the thin film transistor;

forming a first electrode over the interlayer insulating film;

forming the photo sensor element by laminating a first crystalline semiconductor film having a first conductivity, an amorphous semiconductor film, and a second crystalline semiconductor film having a second conductivity over the first electrode and the interlayer insulating film;

forming a second electrode over the second crystalline semiconductor film having the second conductivity;

separating a layer including the photo sensor element and the amplifier circuit from the first substrate; and transferring the layer including the photo sensor element and the amplifier circuit to a second substrate, wherein an end portion of the first electrode is covered with the first crystalline semiconductor film having the first conductivity, and wherein a material of the first electrode is the same as a material of a source electrode or a drain electrode connected to a source region or a drain region of the thin film transistor.

14. The method for manufacturing the semiconductor device according to claim 13, wherein the thin film transistor in the amplifier circuit includes a semiconductor film having a crystal structure.

15. The method for manufacturing the semiconductor device according to claim 13, wherein the chip having the photo sensor element and the amplifier circuit is mounted in a print wiring substrate by a solder reflow process.

16. The method for manufacturing the semiconductor device according to claim 13, wherein an external terminal of the chip has a two-terminal structure.

17. The method for manufacturing the semiconductor device according to claim 13, wherein the amplifier circuit comprises a current mirror circuit.

18. The method for manufacturing the semiconductor device according to claim 13, wherein the second substrate is a plastic film substrate.

19. The method for manufacturing the semiconductor device according to claim 13, further comprising separating the layer including the photo sensor element and the amplifier circuit from the second substrate.

* * * * *